(12) United States Patent
Endo et al.

(10) Patent No.: US 9,318,506 B2
(45) Date of Patent: Apr. 19, 2016

(54) SEMICONDUCTOR DEVICE AND MANUFACTURING METHOD THEREOF

(75) Inventors: Yuta Endo, Kanagawa (JP); Junichi Koezuka, Tochigi (JP); Yuichi Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 357 days.

(21) Appl. No.: 13/540,029

(22) Filed: Jul. 2, 2012

(65) Prior Publication Data

US 2013/0009149 A1    Jan. 10, 2013

(30) Foreign Application Priority Data

Jul. 8, 2011   (JP) .................................. 2011-152016

(51) Int. Cl.
| | | |
|---|---|---|
| H01L 21/00 | (2006.01) | |
| H01L 27/12 | (2006.01) | |
| H01L 29/49 | (2006.01) | |
| H01L 29/786 | (2006.01) | |

(52) U.S. Cl.
CPC ........ *H01L 27/1225* (2013.01); *H01L 27/1218* (2013.01); *H01L 29/4908* (2013.01); *H01L 29/7869* (2013.01); *H01L 29/78603* (2013.01); *H01L 29/78618* (2013.01)

(58) Field of Classification Search
CPC ............ H01L 27/1225; H01L 29/7869; H01L 29/4908; H01L 29/78603; H01L 29/78618
USPC ................................. 257/43, 57, 59
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| EP | 1737044 A | 12/2006 |
| EP | 2159845 A | 3/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Laura Menz
(74) *Attorney, Agent, or Firm* — Eric J. Robinson; Robinson Intellectual Property Law Office, P.C.

(57) ABSTRACT

An object of an embodiment of the present invention is to provide a semiconductor device which includes a transistor including an oxide semiconductor with high field-effect mobility, a small variation in threshold voltage, and high reliability. The semiconductor device includes a transistor which includes an insulating substrate from which oxygen is released by heat treatment and an oxide semiconductor film over the insulating substrate. A channel is formed in the oxide semiconductor film. The insulating substrate from which oxygen is released by heat treatment can be manufactured by implanting oxygen ions into at least a region of an insulating substrate on the side provided with the oxide semiconductor film.

7 Claims, 25 Drawing Sheets

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,493,048 B1 | 12/2002 | Baek et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,713,800 B2 | 5/2010 | Kusumoto et al. |
| 7,732,819 B2 | 6/2010 | Akimoto et al. |
| 7,749,820 B2 | 7/2010 | Miyairi |
| 7,821,002 B2 | 10/2010 | Yamazaki et al. |
| 8,088,654 B2 | 1/2012 | Kusumoto et al. |
| 8,143,115 B2 | 3/2012 | Omura et al. |
| 8,148,721 B2 | 4/2012 | Hayashi et al. |
| 9,082,857 B2 | 7/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0210313 A1 | 9/2007 | Park |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117071 A1 | 5/2010 | Inoue et al. |
| 2010/0230683 A1 | 9/2010 | Miyairi |
| 2011/0284844 A1* | 11/2011 | Endo et al. ............. 257/57 |
| 2012/0168750 A1 | 7/2012 | Hayashi et al. |
| 2012/0175625 A1 | 7/2012 | Yamazaki |
| 2015/0084048 A1 | 3/2015 | Hayashi et al. |
| 2015/0303280 A1 | 10/2015 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2008-103666 A | 5/2008 |
| JP | 2009-224479 A | 10/2009 |
| TW | 200841475 | 10/2008 |
| TW | 201029184 | 8/2010 |
| WO | WO-2004/114391 | 12/2004 |
| WO | WO-2007/055299 | 5/2007 |
| WO | WO-2008/069056 | 6/2008 |
| WO | WO-2008/069255 | 6/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7,8,9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of SOL-Gel-Derived Zinc Oxide Films by Irradiation With Ultraviolet Lamp,", Journal of SOL-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp, 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K at al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest, '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu, or Zn] at Temperatures over 1000 ° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A) May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Crsyt. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan . 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Taiwanese Office Action (Application No. 101123714) Dated Feb. 15, 2016.

* cited by examiner

● In
○ Sn
· Zn
• O

- In
- Ga
- Zn
- O

SEMICONDUCTOR DEVICE AND MANUFACTURING METHOD THEREOF

BACKGROUND OF THE INVENTION

1. Field of the Invention

The present invention relates to a semiconductor device which is provided with a circuit including a semiconductor element such as a transistor. For example, the present invention relates to a power device which is mounted on a power supply circuit; a semiconductor integrated circuit including a memory, a thyristor, a converter, an image sensor, or the like; an electro-optical device typified by a liquid crystal display panel; a light-emitting display device including a light-emitting element; and an electronic device including any of the above as a component.

In this specification, a semiconductor device refers to all types of devices which can function by utilizing semiconductor characteristics; an electro-optical device, a light-emitting display device, a semiconductor circuit, and an electronic device are all included in the category of the semiconductor device.

2. Description of the Related Art

Many transistors formed over a glass substrate or the like are manufactured using amorphous silicon, polycrystalline silicon, or the like, as typically seen in liquid crystal display devices. Although transistors including amorphous silicon have low field-effect mobility, they can be formed over a larger glass substrate. On the other hand, transistors including polycrystalline silicon have high field-effect mobility, but they are not suitable for being formed over a larger glass substrate.

Other than transistors formed using silicon, a technique in which a transistor is formed using an oxide semiconductor and applied to an electronic device or an optical device has attracted attention. For example, a technique of manufacturing a transistor by using zinc oxide or In—Ga—Zn—O-based oxide as oxide semiconductor, and of using the transistor as a switching element of a pixel of a display device and the like is disclosed in Patent Document 1 and Patent Document 2.

A transistor including an oxide semiconductor film is expected to considerably improve performance of a display device because such a transistor has higher field-effect mobility than a transistor including amorphous silicon.

REFERENCE

[Patent Document 1] Japanese Published Patent Application No. 2007-123861
[Patent Document 2] Japanese Published Patent Application No. 2007-096055

SUMMARY OF THE INVENTION

Although the transistor including an oxide semiconductor film has high field-effect mobility, its reliability level is sometimes not enough.

In view of the above problem, an object of an embodiment of the present invention is to provide a transistor including an oxide semiconductor film with high field-effect mobility. Further, another object of an embodiment of the present invention is to provide a transistor including an oxide semiconductor film with a small variation in threshold voltage. Still another object of an embodiment of the present invention is to provide a semiconductor device with high reliability.

An embodiment of the present invention is a semiconductor device including a transistor. The transistor includes an insulating substrate from which oxygen is released by heat treatment and an oxide semiconductor film over the insulating substrate, and a channel is formed in the oxide semiconductor film.

Note that oxygen vacancies in an oxide semiconductor film may cause the threshold voltage of the transistor to shift in the negative direction. It is considered that oxygen vacancies in the oxide semiconductor film form a deep level, and part of the deep level generates electrons or captures holes. In the case where oxygen is sufficiently supplied to the oxide semiconductor film from the insulating substrate, oxygen vacancies in the oxide semiconductor film, which are one of causes of the threshold voltage shift in the negative direction, can be reduced.

Supply of oxygen from the insulating substrate (also referred to as oxygen supplying treatment) allows a reduction of the interface state density at the interface between the oxide semiconductor film and the insulating substrate. As a result, capture of carriers at the interface between the oxide semiconductor film and the insulating substrate, which may be caused by operation of the transistor or the like, can be suppressed; thus, a transistor with little electrical characteristic deterioration can be provided.

The insulating substrate from which oxygen is released by heat treatment can be manufactured by implanting oxygen ions into at least a region of an insulating substrate on the side provided with the oxide semiconductor film.

For example, a semiconductor device according to an embodiment of the present invention includes an insulating substrate from which oxygen is released by heat treatment, an oxide semiconductor film over the insulating substrate, a pair of electrodes in contact with the oxide semiconductor film, a gate insulating film covering the oxide semiconductor film and the pair of electrodes, and a gate electrode overlapping with the oxide semiconductor film with the gate insulating film interposed therebetween.

Further, a semiconductor device according to an embodiment of the present invention includes an insulating substrate from which oxygen is released by heat treatment, an oxide semiconductor film including a low-resistance region and a high-resistance region over the insulating substrate, a gate insulating film over the oxide semiconductor film, and a gate electrode overlapping with the oxide semiconductor film with the gate insulating film interposed therebetween.

The low-resistance region in the oxide semiconductor film can be formed by subjecting part of the oxide semiconductor film to treatment by which resistance is reduced, such as ion implantation, ion doping, or plasma treatment, for example.

In the case where the gate electrode is used as a mask in ion implantation, ion doping, or plasma treatment in the treatment by which resistance is reduced on the oxide semiconductor film, a photolithography step for forming the low-resistance region and the high-resistance region is not necessary; in such a case, a reduction in cost and an increase in productivity are achieved.

A region in the oxide semiconductor film, which is not subjected to the treatment by which resistance is reduced, is referred to as the high-resistance region.

The oxide semiconductor film can be formed by a sputtering method, a molecular beam epitaxy (MBE) method, an atomic layer deposition (ALD) method, or a pulse laser deposition (PLD) method.

In the case where the oxide semiconductor film is formed during the process of heat treatment and/or is subjected to heat treatment after being formed over the insulating substrate, a level formed due to oxygen vacancies can be reduced.

Note that it is preferable that the oxide semiconductor film be formed during the process of heat treatment and be subjected to heat treatment after being formed.

Thus, a semiconductor device which includes a transistor including an oxide semiconductor where a channel is formed with a high field-effect mobility, a small variation in threshold voltage, and high reliability can be provided.

DETAILED DESCRIPTION OF THE INVENTION

Figure 1A:
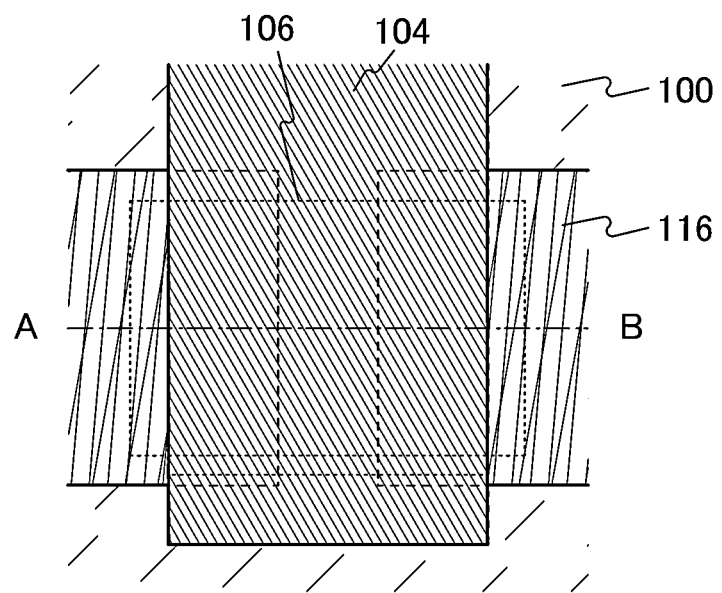
FIG. 1A is a top view of an example of a semiconductor device and FIG. 1B is a cross-sectional view thereof.

Hereinafter, embodiments of the present invention will be described in detail with reference to the accompanying drawings. However, the present invention is not limited to the following description, and it is easily understood by those skilled in the art that modes and details can be modified in various ways. Therefore, the present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain. A portion simply called "source" refers to any of a source electrode and a source region. Further, a portion simply called "drain" refers to any of a drain electrode and a drain region.

Note that voltage refers to a potential difference between a certain potential and a reference potential (e.g., a source potential, a ground potential) in many cases. Accordingly, voltage can also be referred to as potential and vice versa.

Even when it is written in this specification that "to be connected", there is a case in which no physical connection is made in an actual circuit and a wiring is only extended. An element which does not adversely affect circuit operation, such as a resistor, may be included between the connected components.

Note that the ordinal numbers such as "first" and "second" are used for convenience and do not denote the order of steps or the stacking order of layers. In addition, the ordinal numbers in this specification do not denote particular names which specify the present invention.

Embodiment 1

In this embodiment, an example of a transistor that is a semiconductor device according to an embodiment of the present invention will be described with reference to FIGS. 1A and 1B.

FIG. 1A is a top view of the transistor. A cross section along dashed-dotted line A-B in FIG. 1A corresponds to a cross section A-B in FIG. 1B.

Here, the cross section A-B in FIG. 1B will be described in detail.

Figure 1B:
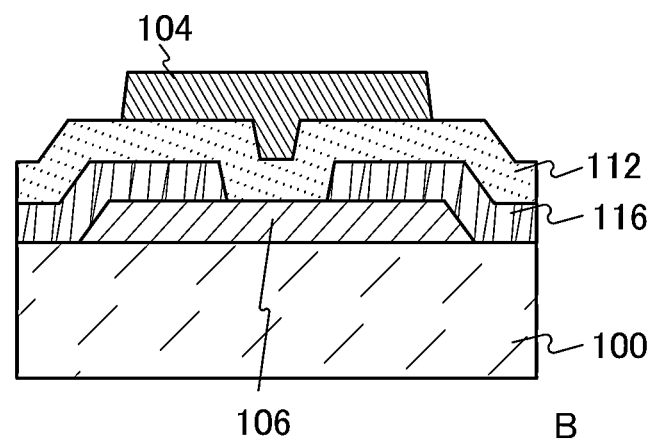

The transistor illustrated in FIGS. 1A and 1B includes a substrate 100, an oxide semiconductor film 106 over the substrate 100, a pair of electrodes 116 which is positioned over the oxide semiconductor film 106 and is at least partly in contact with the oxide semiconductor film 106, a gate insulating film 112 over the oxide semiconductor film 106 and the pair of electrodes 116, and a gate electrode 104 which overlaps with the oxide semiconductor film 106 with the gate insulating film 112 provided therebetween.

As the substrate 100, a substrate from which oxygen is released by heat treatment is used.

"To release oxygen by heat treatment" means that the amount of released oxygen is greater than or equal to $3.0 \times 10^{14}$ atoms/cm$^2$, greater than or equal to $1.0 \times 10^{15}$ atoms/cm$^2$, greater than or equal to $3.0 \times 10^{15}$ atoms/cm$^2$, greater than or equal to $5.0 \times 10^{15}$ atoms/cm$^2$, or greater than or equal to $1.0 \times 10^{16}$ atoms/cm$^2$ in thermal desorption spectroscopy (TDS) on an oxygen atom basis.

The amount of released oxygen is measured by TDS analysis at a substrate temperature higher than or equal to 150° C. and lower than or equal to 700° C., preferably higher than or equal to 200° C. and lower than or equal to 650° C., further preferably higher than or equal to 250° C. and lower than or equal to 470° C. This is because, for example, it is presumed that oxygen release at a substrate temperature lower than 150° C. is mainly caused by oxygen that is adsorbed to a substrate surface and has relatively low stability. Further, when the substrate temperature is set to be lower than or equal to 700° C., the amount of released oxygen that fits an actual manufacturing process of the transistor can be evaluated.

Here, a method for measuring the amount of released oxygen using TDS analysis will be described.

The total amount of released gas in TDS analysis is proportional to the integral value of the ion intensity of the released gas. Then, this integral value is compared with the integral value of the ion intensity of the released gas of a reference sample, whereby the total amount of released gas can be calculated.

For example, the number of released oxygen molecules ($N_{O2}$) from an insulating film can be calculated according to Formula 1 using the TDS analysis results of a silicon wafer containing hydrogen at a predetermined density, which is the reference sample, and the TDS analysis results of the insulating film. Here, all gasses having a mass-to-charge ratio (m/z) of 32 which are obtained by the TDS analysis are assumed to originate from an oxygen molecule. CH$_3$OH can be given as a gas where m/z=32, but is not taken into consideration on the assumption that it is unlikely to be present. Further, an oxygen molecule including an oxygen atom where m/z=17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \quad \text{[FORMULA 1]}$$

$N_{H2}$ is the value obtained by conversion of the number of hydrogen molecules released from the reference sample into density. $S_{H2}$ is the integral value of ion intensity when the reference sample is analyzed by TDS. Here, the reference value of the reference sample is expressed by $N_{H2}/S_{H2}$. $S_{O2}$ is the integral value of ion intensity when the insulating film is analyzed by TDS. $\alpha$ is a coefficient affecting the ion intensity in the TDS analysis. For details of Formula 1, Japanese Published Patent Application No. H6-275697 is referred to. Note that the amount of released oxygen from the above insulating film was measured with a thermal desorption spectroscopy apparatus produced by ESCO Ltd., EMD-WA1000S/W using a silicon wafer containing hydrogen atoms at $1 \times 10^{16}$ atoms/cm$^3$ as the reference sample.

Further, in the TDS analysis, part of oxygen is detected as an oxygen atom. The ratio between oxygen molecules and oxygen atoms can be calculated from the ionization rate of oxygen molecules. Note that, since the above α includes the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

Note that oxygen vacancies in the oxide semiconductor film may cause the threshold voltage of the transistor to shift in the negative direction. It is considered that oxygen vacancies in the oxide semiconductor film form a deep level in the oxide semiconductor film, and part of the deep level generates electrons or captures holes. In the transistor according to an embodiment of the present invention, oxygen is sufficiently supplied to the oxide semiconductor film 106 from the substrate 100; as a result, oxygen vacancies in the oxide semiconductor film 106, which are causes of the threshold voltage shift in the negative direction, can be reduced.

The supply of oxygen from the substrate 100 can reduce the interface state density at the interface between the oxide semiconductor film 106 and the substrate 100. As a result, carrier trapping at the interface between the oxide semiconductor film 106 and the substrate 100 due to operation of the transistor or the like can be suppressed; thus, a transistor with less deterioration in electrical characteristics can be obtained.

The release of oxygen from the substrate 100 may decrease the amount of oxygen released from the substrate 100 by heat treatment; however, the difference is small because the transistor is provided over the substrate 100 and out-diffusion of oxygen is thus suppressed.

The material of the substrate 100 is not particularly limited, but the substrate 100 is an insulating substrate having an insulating property. Further, the substrate 100 has enough heat resistance to withstand heat treatment to be performed later. For example, a glass substrate, a ceramic substrate, a quartz substrate, or a sapphire substrate may be used as the substrate 100. Alternatively, a plastic substrate having enough heat resistance to withstand heat treatment to be performed later may be used.

For the oxide semiconductor film 106 formed later to easily have crystallinity, the surface of the substrate 100 over which the transistor is formed is preferably planar.

Specifically, the substrate 100 with an average surface roughness ($R_a$) of less than or equal to 1 nm, preferably less than or equal to 0.3 nm is used. Note that the average surface roughness ($R_a$) is obtained by expanding, into three dimensions, arithmetic mean surface roughness that is defined by JIS B 0601: 2001 (ISO4287:1997) so as to be able to apply it to a curved surface. $R_a$ can be expressed as an "average value of the absolute values of deviations from a reference surface to a designated surface" and is defined by Formula 2.

$$Ra = \frac{1}{S_0} \int_{y1}^{y2} \int_{x1}^{x2} |f(x, y) - Z_0| dx dy \quad \text{[FORMULA 2]}$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the average height of the designated surface. $R_a$ can be measured using an atomic force microscope (AFM).

For the oxide semiconductor film 106, any of the followings can be used for example: two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material, three-component metal oxides such as an In—Ga—Zn—O-based material, an In—Al—Zn—O-based material, an In—Sn—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, an In—Lu—Zn—O-based material, and an In—Ni—Zn—O-based material and four-component metal oxides such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, and an In—Hf—Al—Zn—O-based material.

For example, an "In—Ga—Zn—O-based material" means an oxide containing In, Ga, and Zn as its main components and there is no particular limitation on the atomic ratio of In:Ga:Zn.

In the case where an In—Zn—O-based material is used for the oxide semiconductor film 106, the atomic ratio of In to Zn is in the range of 0.5:1 to 50:1, preferably 1:1 to 20:1, more preferably 1.5:1 to 15:1. When the atomic ratio of In to Zn is in the above range, the field-effect mobility of the transistor can be increased. Here, when the atomic ratio of In:Zn:O of the compound is X:Y:Z, Z>1.5X+Y is preferably satisfied.

A material represented by $InMO_3(ZnO)_m$ (m>0) may be used for the oxide semiconductor film 106. Here, M represents one or more metal elements selected from Zn, Ga, Al, Mn, Sn, Hf, and Co. For example, M may be Ga, Ga and Al, Ga and Mn, Ga and Co, or the like.

For the oxide semiconductor film 106, a material which has a band gap of 2.5 eV or more, preferably 2.8 eV or more, further preferably 3.0 eV or more is selected to reduce the off-state current of the transistor. However, a material having semiconductor characteristics whose band gap is within the above range may be used instead of the oxide semiconductor film.

Hydrogen which is an impurity for the oxide semiconductor partly serves as a donor to generate a carrier. Therefore, the concentration of hydrogen in the oxide semiconductor film 106 is lower than $5 \times 10^{18}$ atoms/cm$^3$, preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$.

Alkali metal is not an element included in an oxide semiconductor, and therefore, is an impurity. Also, alkaline earth metal is impurity in the case where alkaline earth metal is not included in an oxide semiconductor. Alkali metals, in particular, sodium (Na) diffuses in an insulating film which is in contact with the oxide semiconductor film to become Na$^+$. In addition, in the oxide semiconductor film, Na cuts or enters a bond between metal and oxygen which are included in an oxide semiconductor. As a result, for example, deterioration of transistor characteristics such as the threshold voltage shift in the negative direction, which leads to a normally-on state transistor, or a reduction in field-effect mobility occurs; in addition, variation in characteristics is also caused. Therefore, it is preferable to reduce the concentration of the impurity in the oxide semiconductor film. Specifically, it is preferable that the Na concentration which is measured by secondary ion mass spectroscopy (SIMS) be lower than or equal to $5 \times 10^{16}$ atoms/cm$^3$, further preferably lower than or equal to $1 \times 10^{16}$ atoms/cm$^3$, still further preferably lower than or equal to $1 \times 10^{15}$ atoms/cm$^3$. In addition, the measurement value of the concentration of lithium (Li) is preferably lower than or equal to $5 \times 10^{15}$ atoms/cm$^3$, further preferably lower than or equal to $1 \times 10^{15}$ atoms/cm$^3$. Further, the measurement value of the concentration of potassium (K) is preferably lower than or equal to $5 \times 10^{15}$ atoms/cm$^3$, further preferably lower than or equal to $1 \times 10^{15}$ atoms/cm$^3$.

The oxide semiconductor film 106 is an oxide semiconductor film in which hydrogen, an alkali metal, an alkaline earth metal, and the like are reduced and whose concentration of impurities is very low. Therefore, in a transistor whose channel region is formed using the oxide semiconductor film 106, off-state current can be reduced.

The use of the oxide semiconductor film 106 described above makes it possible to reduce the off-state current of the transistor. For example, the off-state current of the transistor where the channel length is 3 μm and the channel width is 1 μm can be less than or equal to $1 \times 10^{-18}$ A, less than or equal to $1 \times 10^{-21}$ A, or less than or equal to $1 \times 10^{-24}$ A.

With an In—Sn—Zn—O-based material, high field-effect mobility can be relatively easily realized. Specifically, the field-effect mobility of the transistor can be increased to 31 cm$^2$/Vs or more, 40 cm$^2$/Vs or more, 60 cm$^2$/Vs or more, 80 cm$^2$/Vs or more, or 100 cm$^2$/Vs or more. Further, even with a material (e.g., an In—Ga—Zn—O-based material) other than the In—Sn—Zn—O-based material, the field-effect mobility can be increased by reducing the defect density.

The field-effect mobility of transistors will be described below with reference to FIG. 21, FIGS. 22A to 22C, FIGS. 23A to 23C, and FIGS. 24A to 24C.

The field-effect mobility of a transistor tends to be measured lower than its inherent field-effect mobility for a variety of reasons; this phenomenon occurs not only in the case of using an oxide semiconductor. One of the causes for a reduction in the field-effect mobility is a defect inside a semiconductor or a defect at an interface between the semiconductor and an insulating film. Here, the field-effect mobility on the assumption that no defect exists inside the semiconductor is calculated theoretically by using a Levinson model. The field-effect mobility of a transistor tends to be measured lower than its inherent field-effect mobility for a variety of reasons; this phenomenon occurs not only in the case of using an oxide semiconductor.

Assuming that the inherent field-effect mobility of the transistor is $\mu_0$ and a potential barrier (such as a grain boundary) exists in the semiconductor, the measured field-effect mobility μ is expressed by Formula 3.

$$\mu = \mu_0 \exp\left(-\frac{E}{kT}\right) \qquad \text{[FORMULA 3]}$$

Here, E represents the height of the potential barrier, k represents the Boltzmann constant, and T represents the absolute temperature. Note that according to the Levinson model, the height of the potential barrier E is assumed to be attributed to a defect and is expressed by Formula 4.

$$E = \frac{e^2 N^2}{8\varepsilon n} = \frac{e^3 N^2 t}{8\varepsilon C_{ox} V_{gs}} \qquad \text{[FORMULA 4]}$$

Here, e represents the elementary charge, N represents the average defect density per unit area of a channel, ∈ represents the dielectric constant of the semiconductor, n represents the carrier density per unit area of the channel, $C_{ox}$ represents the capacitance of the gate insulating film per unit area, $V_{gs}$ represents the gate voltage, and t represents the thickness of the channel. In the case where the thickness of the semiconductor layer is 30 nm or less, the thickness of the channel may be regarded as being the same as the thickness of the semiconductor layer.

The drain current $I_{ds}$ in a linear region is expressed by Formula 5.

$$\frac{I_{ds}}{V_{gs}} = \frac{W\mu V_{gs} V_{ds} C_{ox}}{L} \exp\left(-\frac{E}{kT}\right) \qquad \text{[FORMULA 5]}$$

Here, L represents the channel length and W represents the channel width, and L and W are each set at 10 μm. In addition, $V_{ds}$ represents the drain voltage.

When taking logarithms of both sides of Formula 5, Expression 6 can be obtained.

$$\ln\left(\frac{I_{ds}}{V_{gs}}\right) = \ln\left(\frac{W\mu V_{ds} C_{ox}}{L}\right) - \frac{E}{kT} = \ln\left(\frac{W\mu V_{ds} C_{ox}}{L}\right) - \frac{e^3 N^2 t}{8kT\varepsilon C_{ox} V_{gs}} \qquad \text{[FORMULA 6]}$$

Since the right side of Formula 6 is a function of gate voltage $V_{gs}$, the defect density N can be obtained from the slope of a line showing a relation between $\ln(I_{ds}/V_{gs})$ indicated in the ordinate and $1/V_{gs}$ indicated in the abscissa. That is, the defect density N in the semiconductor can be obtained from the $V_{gs}$–$I_{ds}$ characteristics of the transistor.

Defect density N in a semiconductor depends on a substrate heating temperature in the formation of the semiconductor. In the case where the semiconductor is an oxide semiconductor deposited using an In—Sn—Zn—O target of In:Sn:Zn=1:1:1 [atomic ratio], the defect density N in the oxide semiconductor is approximately $1 \times 10^{12}/\text{cm}^2$.

Calculating with Formulae 3 and 4 on the basis of the above defect density N in the oxide semiconductor, the inherent field-effect mobility $\mu_0$ of the transistor comes to be 120 cm²/Vs. Thus, in an ideal transistor in which no defect exists inside the oxide semiconductor and at the interface between the oxide semiconductor and the gate insulating film that is in contact with the oxide semiconductor, the field-effect mobility $\mu_0$ to is found to be 120 cm²/Vs. By contrast, in the case of using an oxide semiconductor with many defects, the field-effect mobility μ of a transistor is approximately 30 cm²/Vs.

Further, even when no defect exists inside the semiconductor, scattering at an interface between the channel region and the gate insulating film adversely affects the transport properties of the transistor. The field-effect mobility $\mu_1$ at a position that is distance x away from the interface between the channel region and the gate insulating film is expressed by Formula 7.

$$\frac{1}{\mu_1} = \frac{1}{\mu_0} + \frac{D}{B}\exp\left(-\frac{x}{l}\right) \qquad \text{[FORMULA 7]}$$

Here, D represents the electric field intensity by the gate electrode, B represents a constant, and l represents the depth to which the adverse effect of scattering at the interface is caused. Values of B and l can be obtained from actual measurement of the electrical characteristics of the transistor; according to actual measurement of the electrical characteristics of the transistor including the above oxide semiconductor, B is $4.75 \times 10^7$ cm/s and l is 10 nm. As D is increased, i.e., as the gate voltage $V_{gs}$ is increased, the second term of Formula 7 increases and accordingly the field-effect mobility $\mu_1$ decreases.

Figure 21:
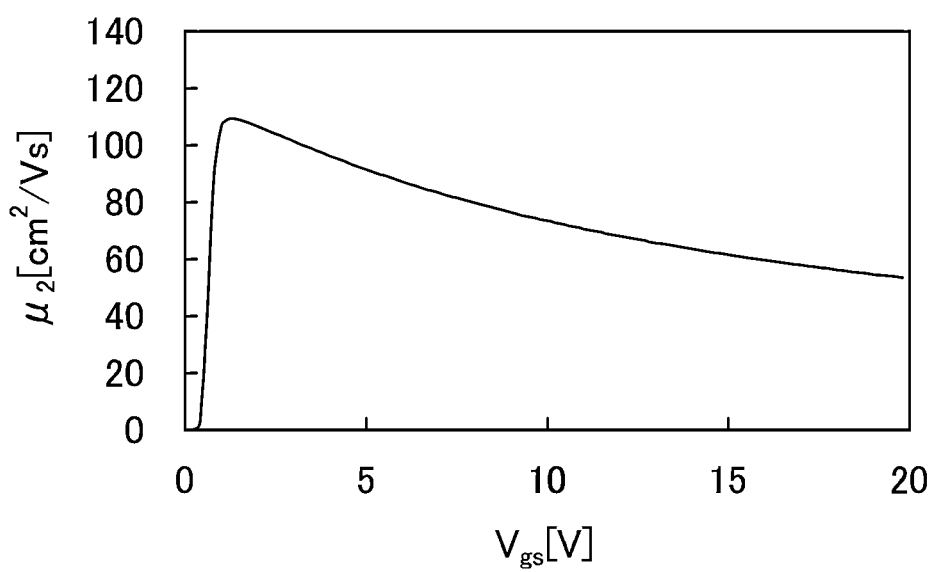
FIG. 21 shows gate voltage $V_{gs}$ dependence of field-effect mobility obtained by calculation.

FIG. 21 shows calculation results of the field-effect mobility $\mu_2$ of an ideal transistor in which no defect exists inside an oxide semiconductor and at an interface between the oxide semiconductor and a gate insulating film that is in contact with the oxide semiconductor. For the calculation, Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work function of a gate of the transistor was assumed to be 5.5 eV and that of each of a source and a drain of the transistor was assumed to be 4.6 eV. The thickness of the gate insulating film was assumed to be 100 nm, and the relative permittivity thereof was assumed to be 4.1. The channel length and the channel width were each assumed to be 10 μm and the drain voltage $V_{ds}$ was assumed to be 0.1 V.

As shown in FIG. 21, the field-effect mobility $\mu_2$ has a peak of 100 cm²/Vs or more at a gate voltage $V_{gs}$ of around 1 V, and then decreases as the gate voltage $V_{gs}$ becomes higher because the influence of interface scattering increases.

Calculation results in the case where such an ideal transistor is miniaturized are shown in FIGS. 22A to 22C, FIGS. 23A to 23C, and FIGS. 24A to 24C. Note that in the calculation, a transistor having the structure illustrated in FIGS. 25A to 25C was assumed.

Figure 25A:
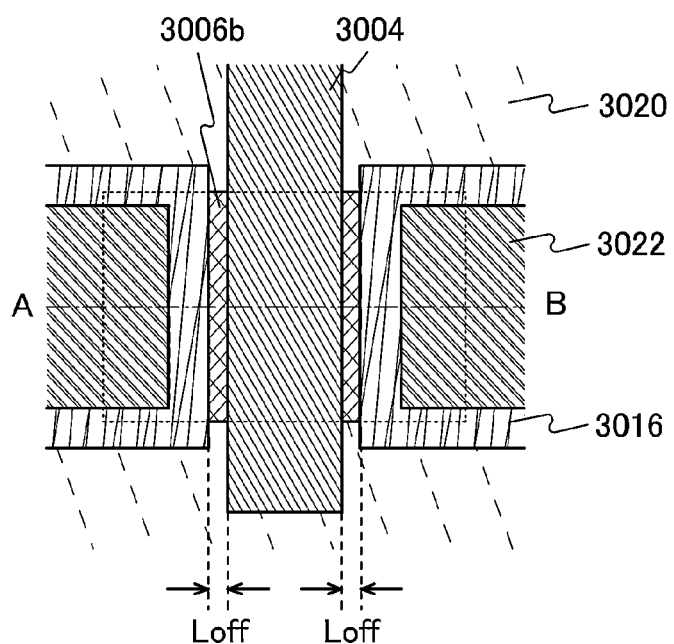
FIG. 25A is a top view of a transistor used for calculation and FIGS. 25B and 25C are cross-sectional views thereof.
Figure 25B:
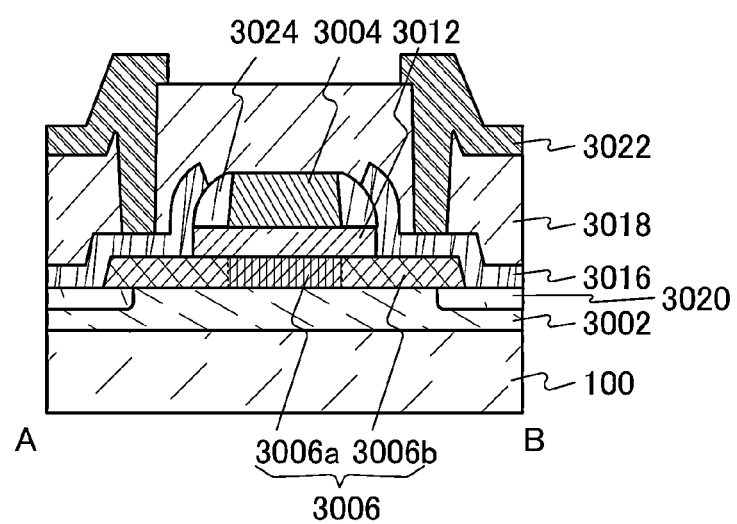

Next, the structure of the transistor in FIGS. 25A to 25C will be described. FIG. 25A is a top view of the transistor. FIG. 25B is a cross-sectional view along dashed-dotted line A-B in FIG. 25A.

The transistor illustrated in FIG. 25B includes a base insulating film 3002 provided over the substrate 100; a protective film 3020 provided on the periphery of the base insulating film 3002; an oxide semiconductor film 3006 which is provided over the base insulating film 3002 and the protective film 3020 and includes a high-resistance region 3006a and a low-resistance region 3006b; a gate insulating film 3012 provided over the oxide semiconductor film 3006; a gate electrode 3004 provided to overlap with the oxide semiconductor film 3006 with the gate insulating film 3012 provided therebetween; sidewall insulating films 3024 provided in contact with side surfaces of the gate electrode 3004; a pair of electrodes 3016 which is provided over the oxide semiconductor film 3006 and is at least partly in contact with the oxide semiconductor film 3006; a protective insulating film 3018 provided to cover the gate electrode 3004, the sidewall insulating films 3024, and the pair of electrodes 3016; and wirings 3022 which are provided in contact with the pair of electrodes 3016 through openings provided in the protective insulating film 3018.

Here, the resistivity of the low-resistance region 3006b was assumed to be $2 \times 10^{-3}$ Ωcm, and the width of the gate electrode 3004, that of the sidewall insulating film 3024, and the channel width were assumed to be 33 nm, 5 nm, and 40 nm, respectively. Note that although the channel region is referred to as high-resistance region 3006a for convenience, the channel region was assumed to be an intrinsic semiconductor here.

Figure 22A:
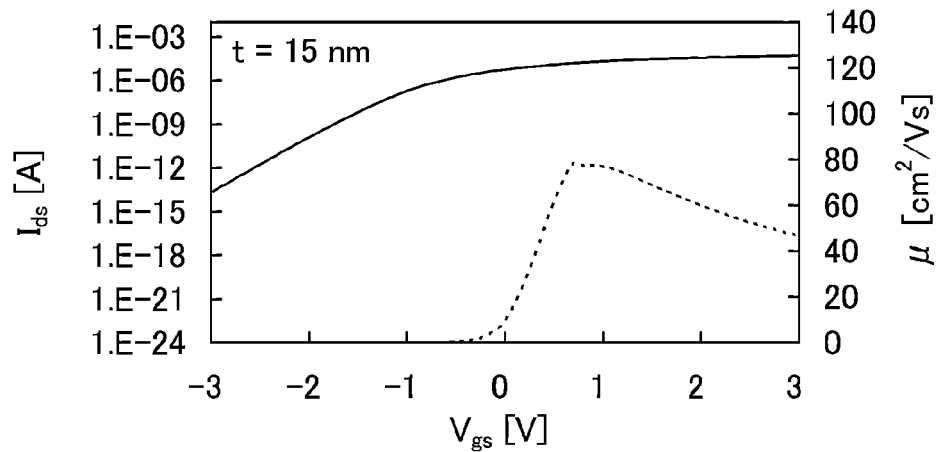
FIGS. 22A to 22C show the gate voltage $V_{gs}$ dependence of drain current $I_{ds}$ and field-effect mobility, which is obtained by calculation.
Figure 22B:
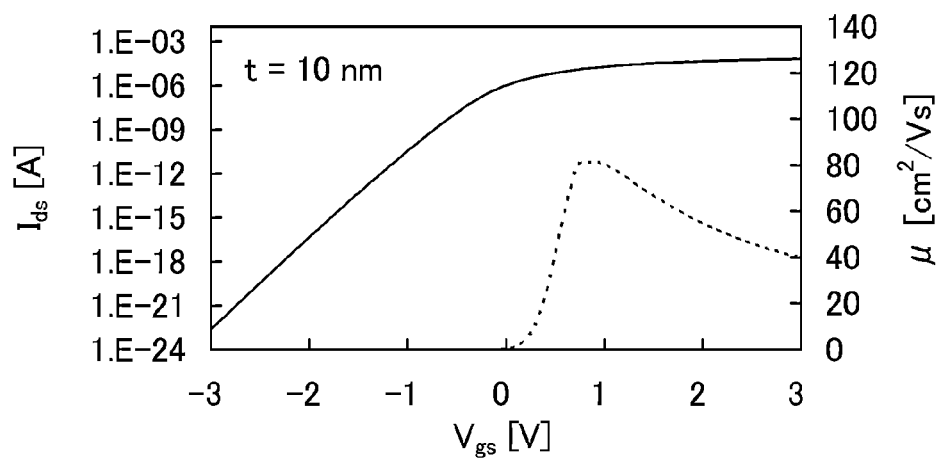
Figure 22C:
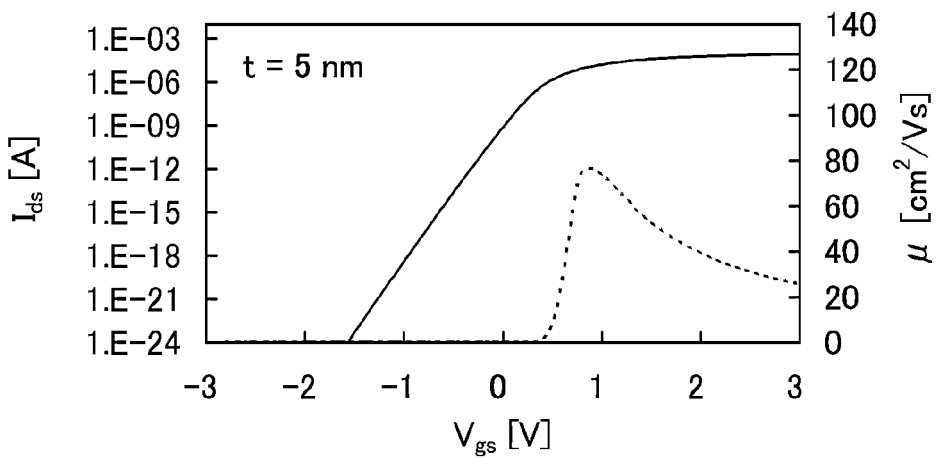

For the calculation, Sentaurus Device manufactured by Synopsys, Inc. was used. FIGS. 22A to 22C show gate voltage $V_{gs}$ dependence of drain current $I_{ds}$ (a solid line) and the field-effect mobility μ (a dotted line) of the transistor having the structure illustrated in FIG. 25B. Note that the drain current $I_{ds}$ was obtained in the condition in which the drain voltage $V_{ds}$ was 1 V and the field-effect mobility μ was obtained in the condition in which the drain voltage $V_{ds}$ was 0.1 V. FIG. 22A shows the results where the thickness of the gate insulating film was 15 nm, FIG. 22B shows the results where the thickness of the gate insulating film was 10 nm, and FIG. 22C shows the results where the thickness of the gate insulating film was 5 nm.

FIGS. 22A to 22C show that as the gate insulating film is thinner, the drain current $I_{ds}$ in an off state (here, in the range of gate voltage $V_{gs}$ from −3 V to 0 V) decreases. On the other hand, there is no noticeable change in the peak value of the field-effect mobility μ and the drain current $I_{ds}$ in an on state (here, in the range of gate voltage $V_{gs}$ from 0 V to 3 V). FIGS. 22A to 22C show that drain current $I_{ds}$ exceeds 10 μA, which is requisite for a memory and the like that are semiconductor devices, at a gate voltage $V_{gs}$ of around 1 V.

Figure 25C:
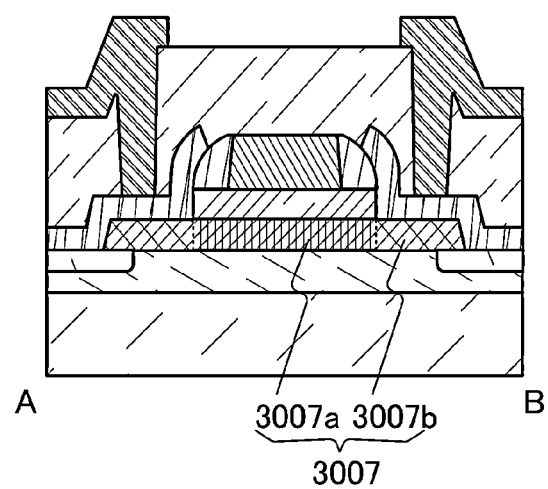

Similarly, the calculation was also conducted on the transistor illustrated in FIG. 25C. The transistor illustrated in FIG. 25C is different from the transistor illustrated in FIG. 25B in that an oxide semiconductor film 3007 including a high-resistance region 3007a and a low-resistance region 3007b is provided. Specifically, in the transistor illustrated in FIG. 25C, a region of the oxide semiconductor film 3007 which overlaps with the sidewall insulating film 3024 is included in the high-resistance region 3007a. The transistor is, in other words, a transistor having an offset region whose width is the same as the width of the sidewall insulating film 3024. Note that the width of the offset region is also referred to as an offset length (Loff) (see FIG. 25A). Note that $L_{off}$ on the right side is the same as $L_{off}$ on the left side here, for the sake of convenience.

Figure 23A:
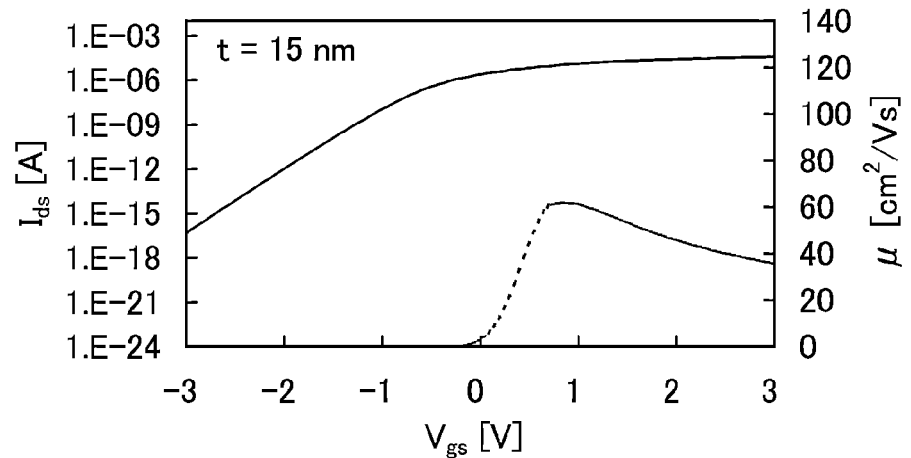
FIGS. 23A to 23C show the gate voltage $V_{gs}$ dependence of drain current $I_{ds}$ and field-effect mobility, which is obtained by calculation.
Figure 23B:
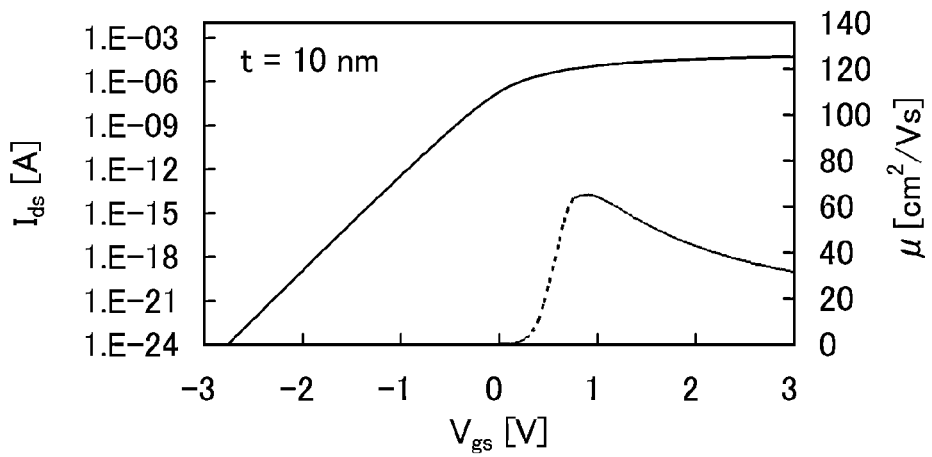
Figure 23C:
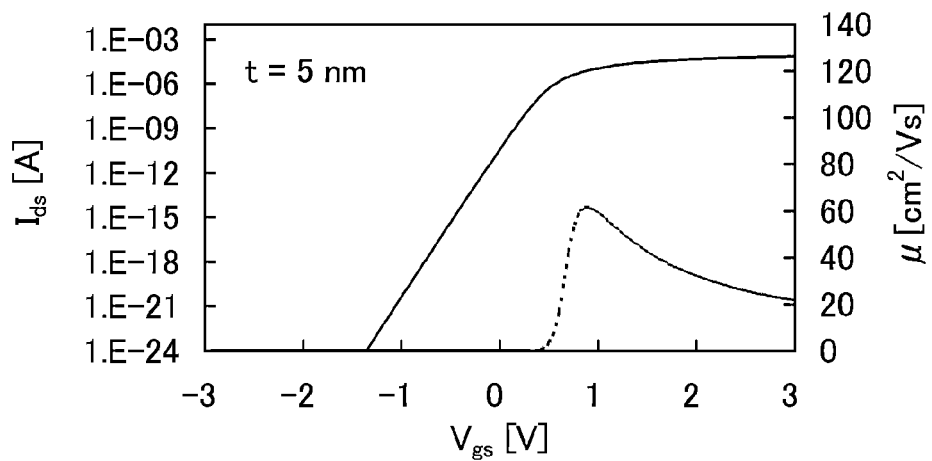

FIGS. 23A to 23C show gate voltage $V_{gs}$ dependence of the drain current $I_{ds}$ (a solid line) and the field-effect mobility μ (a dotted line) of the transistor illustrated in FIG. 25C in the case where $L_{off}$ is 5 nm. Note that drain current $I_{ds}$ was obtained in the condition in which the drain voltage $V_{ds}$ was 1 V and the field-effect mobility μ was obtained in the condition in which the drain voltage $V_{ds}$ was 0.1 V. FIG. 23A shows the results where the thickness of the gate insulating film was 15 nm, FIG. 23B shows the results where the thickness of the gate insulating film was 10 nm, and FIG. 23C shows the results where the thickness of the gate insulating film was 5 nm.

Figure 24A:
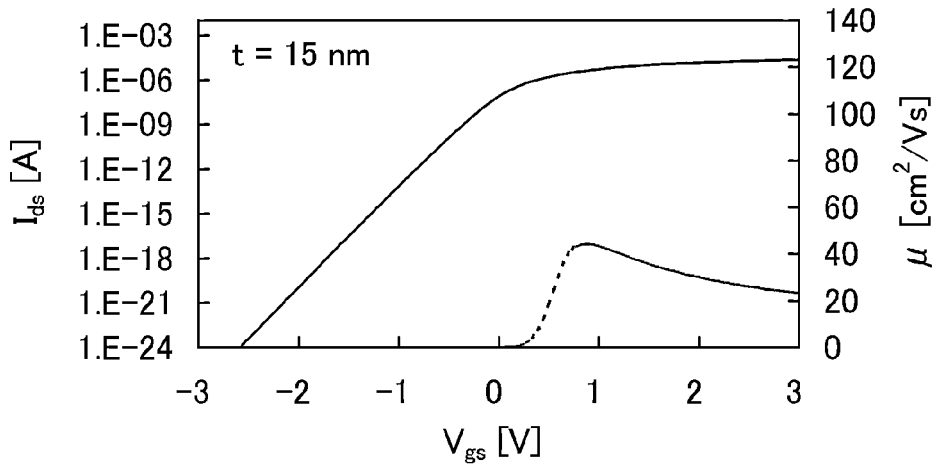
FIGS. 24A to 24C show the gate voltage $V_{gs}$ dependence of drain current $I_{ds}$ and field-effect mobility, which is obtained by calculation.
Figure 24B:
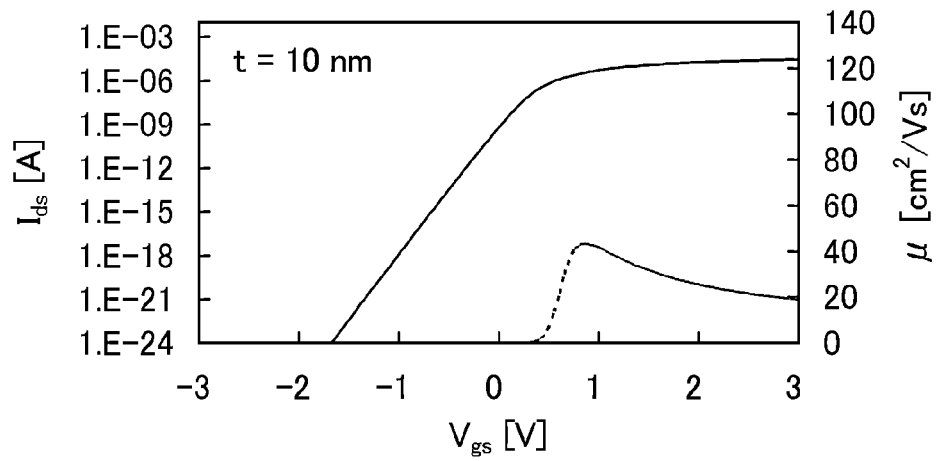
Figure 24C:
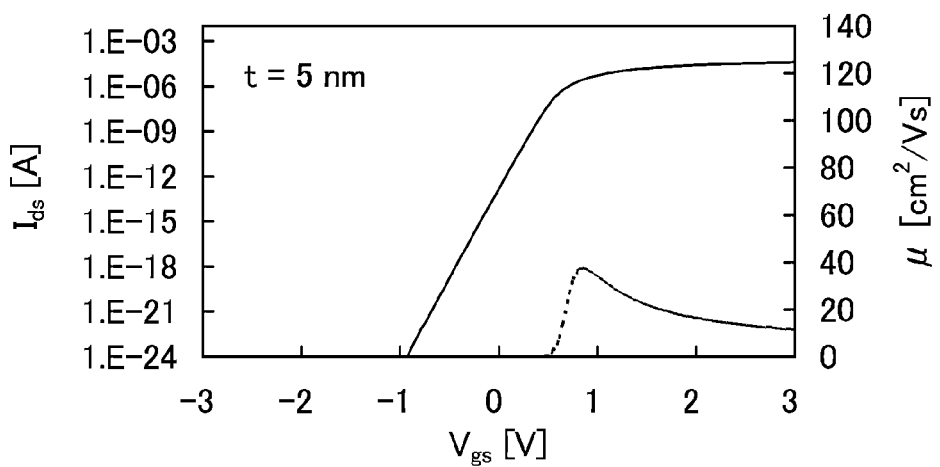

FIGS. 24A to 24C show gate voltage $V_{gs}$ dependence of the drain current $I_{ds}$ (a solid line) and the field-effect mobility μ (a dotted line) of the transistor illustrated in FIG. 25C in the case where $L_{off}$ is 15 nm. Note that the drain current $I_{ds}$ was obtained in the condition in which the drain voltage $V_{ds}$ was 1 V and the field-effect mobility μ was obtained in the condition in which the drain voltage $V_{ds}$ was 0.1 V. FIG. 24A shows the results where the thickness of the gate insulating film was 15 nm, FIG. 24B shows the results where the thickness of the gate insulating film was 10 nm, and FIG. 24C shows the results where the thickness of the gate insulating film was 5 nm.

Both the calculation results in FIGS. 23A to 23C and those in FIGS. 24A to 24C show that similarly to FIGS. 22A to 22C, as the gate insulating film is thinner, the drain current $I_{ds}$ in an off state (here, in the range of gate voltage $V_{gs}$ from −3 V to 0 V) decreases. On the other hand, it is also found that there is no noticeable change in the peak value of the field-effect mobility μ and the drain current $I_{ds}$ in an on state (here, in the range of gate voltage $V_{gs}$ from 0 V to 3 V).

Note that the peak of the field-effect mobility μ is approximately 80 cm²/Vs in FIGS. 22A to 22C, approximately 60 cm²/Vs in FIGS. 23A to 23C, and approximately 40 cm²/Vs in FIGS. 24A to 24C; thus, the peak of the field-effect mobility μ decreases as $L_{off}$ is increased. Further, it can be seen that the same applies to drain current $I_{ds}$ in the off state. The drain current $I_{ds}$ in an on state also decreases as $L_{off}$ is increased, which is, however, much more gradual than the decrease in drain current $I_{ds}$ in the off-state current. Each calculation result shows that the drain current $I_{ds}$ exceeds 10 μA, which is requisite for a memory and the like, at a gate voltage $V_{gs}$ of around 1 V.

This is the description of the field-effect mobility of transistors.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts (or crystal regions) and amorphous parts (or amorphous regions) are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

An example of a crystal structure of the CAAC-OS film will be described in detail with reference to FIGS. 17A to 17E, FIGS. 18A to 18C, and FIGS. 19A to 19C. In FIGS. 17A to 17E, FIGS. 18A to 18C, and FIGS. 19A to 19C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 17A to 17E, O surrounded by a circle represents tetracoordinate O and O surrounded by a double circle represents tricoordinate O.

Figure 17A:
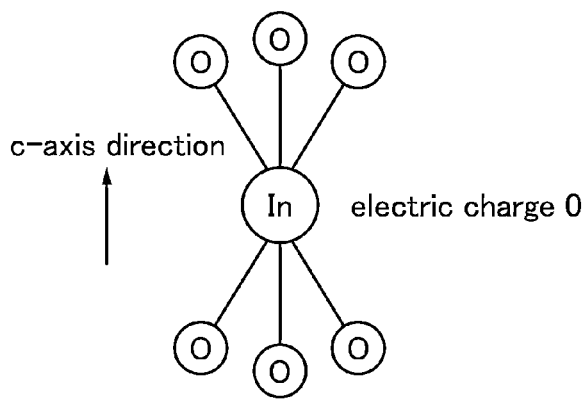
FIGS. 17A to 17E illustrate crystalline structures of oxide semiconductors according to an embodiment of the present invention.

FIG. 17A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 17A is actually an octahedral structure, but is illustrated as a planar structure for simplicity. Note that three tetracoordinate O atoms exist in each of an upper half and a lower half in FIG. 17A. In the small group illustrated in FIG. 17A, electric charge is 0.

Figure 17D:
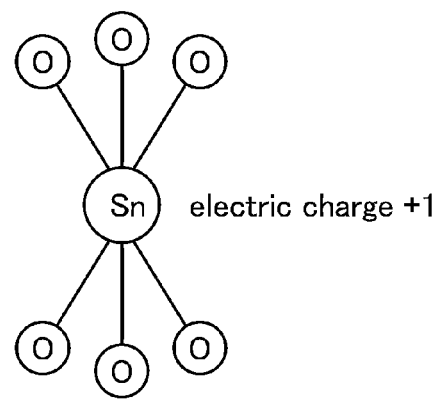
Figure 17B:
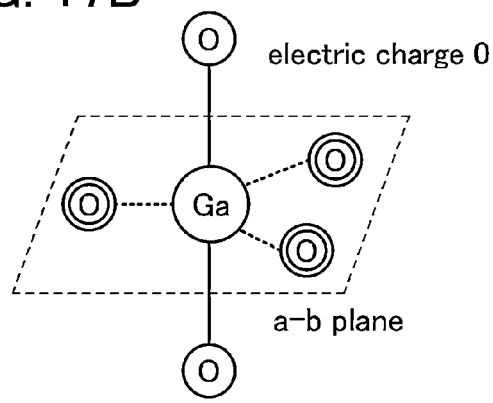

FIG. 17B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 17B. An In atom can also have the structure illustrated in FIG. 17B because an In atom can have five ligands. In the small group illustrated in FIG. 17B, electric charge is 0.

Figure 17E:
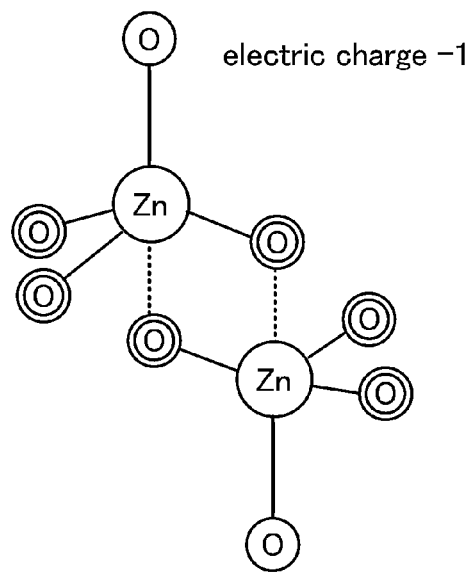
Figure 17C:
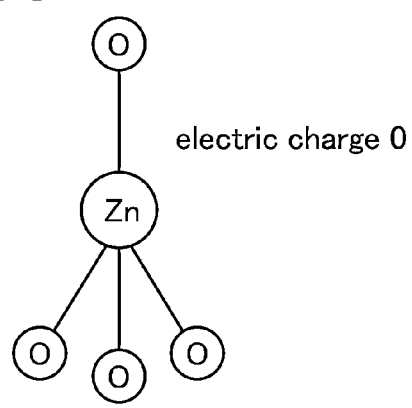

FIG. 17C illustrates a structure including one tetracoordinate Zn atom and four tetracoordinate O atoms proximate to the Zn atom. In FIG. 17C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 17C. In the small group illustrated in FIG. 17C, electric charge is 0.

FIG. 17D illustrates a structure including one hexacoordinate Sn atom and six tetracoordinate O atoms proximate to the Sn atom. In FIG. 17D, three tetracoordinate O atoms exist in each of an upper half and a lower half. In the small group illustrated in FIG. 17D, electric charge is +1.

FIG. 17E illustrates a small group including two Zn atoms. In FIG. 17E, one tetracoordinate O atom exists in each of an upper half and a lower half. In the small group illustrated in FIG. 17E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 17A each have three proximate In atoms in the downward direction, and the three O atoms in the lower half each have three proximate In atoms in the upward direction. The one O atom in the upper half with respect to the pentacoordinate Ga atom in FIG. 17B has one proximate Ga atom in the downward direction, and the one O atom in the lower half has one proximate Ga atom in the upward direction. The one O atom in the upper half with respect to the tetracoordinate Zn atom in FIG. 17C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 18A:
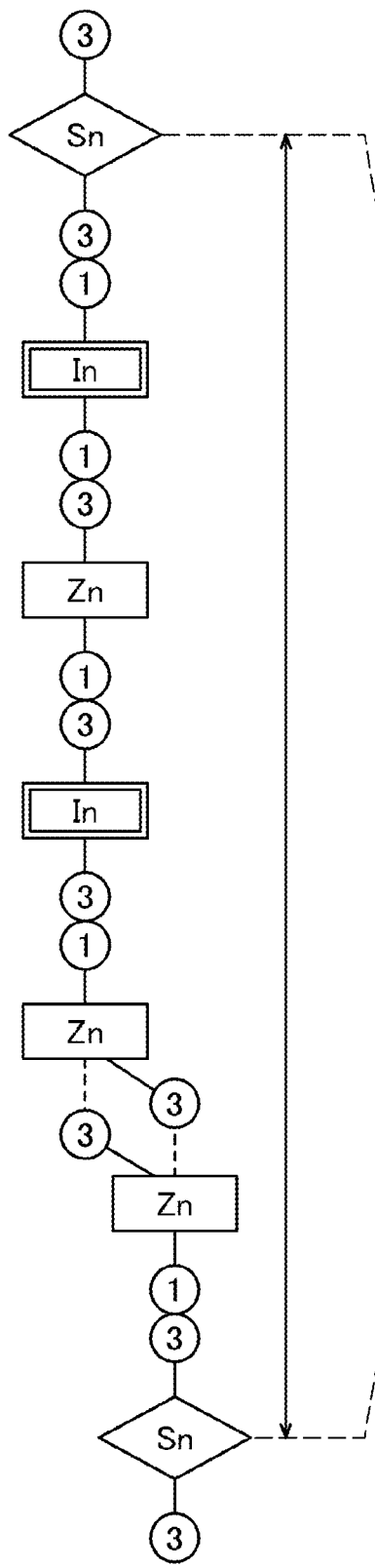
FIGS. 18A to 18C illustrate a crystalline structure of an oxide semiconductor according to an embodiment of the present invention.
Figure 18B:
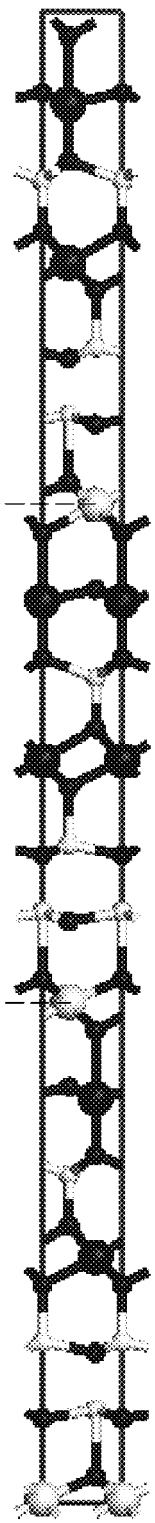
Figure 18C:
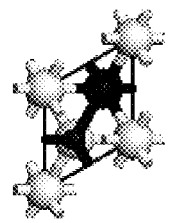

FIG. 18A illustrates a model of a medium group included in a layered structure of an In—Sn—Zn—O-based material. FIG. 18B illustrates a large group including three medium groups. Note that FIG. 18C illustrates an atomic arrangement in the case where the layered structure in FIG. 18B is observed from the c-axis direction.

In FIG. 18A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 18A, one tetracoordinate O atom existing in each of an upper half and a lower half with respect to an In atom is denoted by circled 1. FIG. 18A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 18A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 17E can be given. For example, with one small group including two Zn atoms, electric charge of one small group including a Sn atom can be cancelled, so that the total electric charge of the layered structure can be 0.

When the large group illustrated in FIG. 18B is repeated, a crystal of an In—Sn—Zn—O-based material ($In_2SnZn_3O_8$) can be obtained. Note that a layered structure of the obtained In—Sn—Zn—O-based material can be expressed as a composition formula, $In_2SnZnO_6(ZnO)_m$ (m is a natural number).

The above-described rule also applies to the following materials: a four-component metal oxide such as an In—Sn—Ga—Zn—O-based material; three-component metal oxides such as an In—Ga—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, an In—Lu—Zn—O-based material, and an In—Ni—Zn—O-based material; two-component metal oxides such as an In—Zn—O-based material, a Sn—Zn—O-based material, an Al—Zn—O-based material, a Zn—Mg—O-based material, a Sn—Mg—O-based material, an In—Mg—O-based material, and an In—Ga—O-based material; and the like.

Figure 19A:
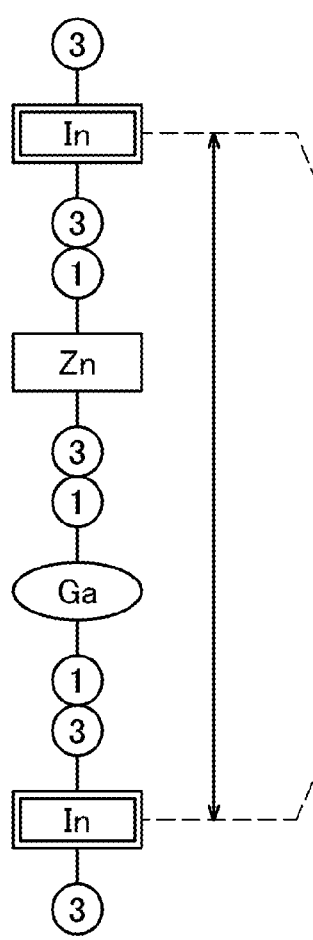
FIGS. 19A to 19C illustrate a crystalline structure of an oxide semiconductor according to an embodiment of the present invention.

As an example, FIG. 19A illustrates a model of a medium group included in a layered structure of an In—Ga—Zn—O-based material.

In the medium group included in the layered structure of the In—Ga—Zn—O-based material in FIG. 19A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 19B:
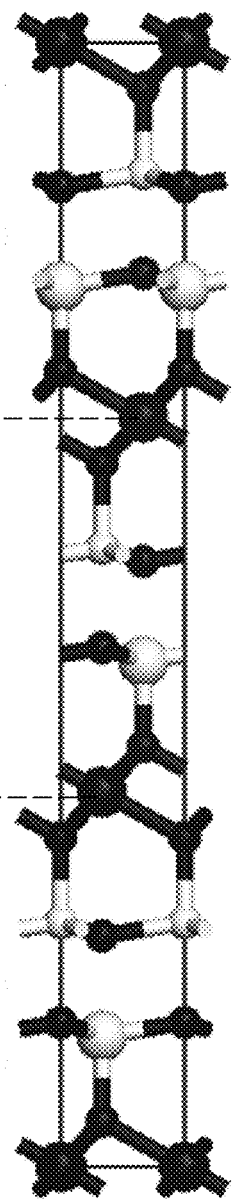
Figure 19C:
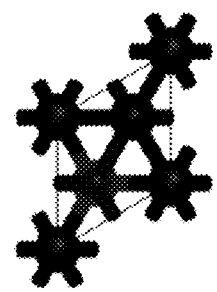

FIG. 19B illustrates a large group including three medium groups. Note that FIG. 19C illustrates an atomic arrangement in the case where the layered structure in FIG. 19B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 19A but also a medium group in which the arrangement of the In atom, the Ga atom, and the Zn atom is different from that in FIG. 19A.

When the large group illustrated in FIG. 19B is repeated, a crystal of an In—Ga—Zn—O-based material can be obtained. Note that a layered structure of the obtained In—Ga—Zn—O-based material can be expressed as a composition formula, $InGaO_3(ZnO)_n$ (n is a natural number).

Figure 20A:
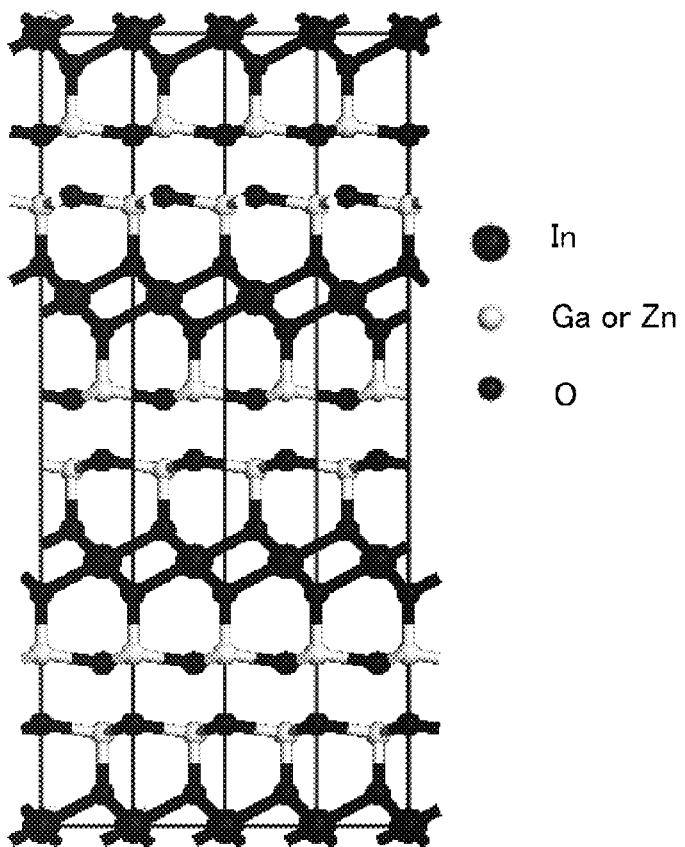
FIGS. 20A and 20B illustrate crystal structures of oxide semiconductors according to an embodiment of the present invention.

In the case where n=1 ($InGaZnO_4$), a crystal structure illustrated in FIG. 20A can be obtained, for example. Note that in the crystal structure in FIG. 20A, since a Ga atom and an In atom each have five ligands as illustrated in FIG. 17B, Ga can be replaced with In.

Figure 20B:
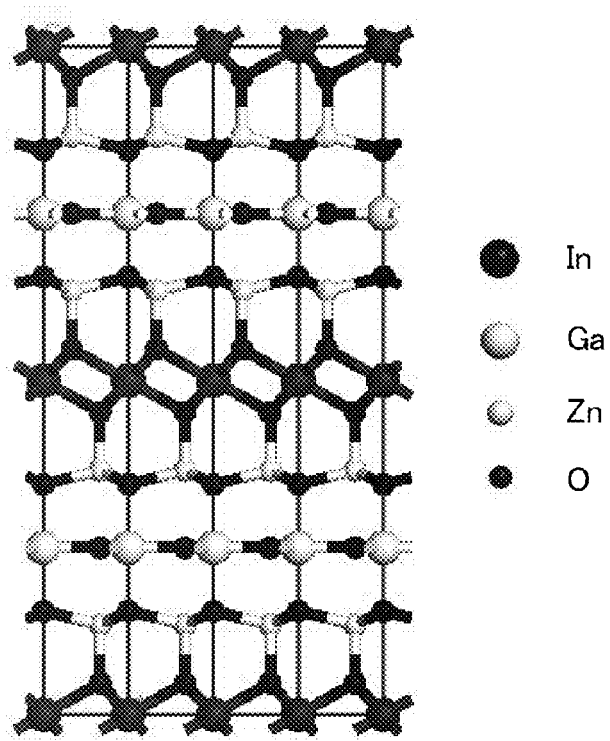

In the case where n=2 ($InGaZn_2O_5$), a crystal structure illustrated in FIG. 20B can be obtained, for example. Note that in the crystal structure in FIG. 20B, since a Ga atom and an In atom each have five ligands as described in FIG. 17B, Ga can be replaced with In.

This is the description of crystal structures of the CAAC-OS film.

Referring back to FIGS. 1A and 1B, the gate electrode 104 may be formed to have a single-layer structure or a stacked-layer structure, using at least one of the following materials: Al, Ti, Cr, Co, Ni, Cu, Y, Zr, Mo, Ag, Ta, and W; a nitride of any of these elements; an oxide of any of these elements; and an alloy of any of these elements.

Although the gate electrode 104 does not completely cover the oxide semiconductor film 106 in FIGS. 1A and 1B, the oxide semiconductor film 106 may be completely covered with the gate electrode 104 in order to prevent light from causing degradation of the oxide semiconductor film 106 and generation of an electric charge in the oxide semiconductor film 106.

The pair of electrodes 116 functions as source and drain electrodes in operation of the transistor.

The pair of electrodes 116 may be formed using a material similar to that of the gate electrode 104.

If a film including Cu is used for the pair of electrodes 116, in the case of providing a wiring in the same layer as the pair of electrodes 116, the resistance of the wiring can be reduced, whereby occurrence of wiring delay can be reduced even in a large-sized display device. In the case of using Cu for the pair of electrodes 116, the adhesion may be poor depending on the material of the substrate 100; thus, it is preferable for the pair of electrodes 116 to have a stacked-layer structure including a film having favorable adhesion property to the substrate 100. As the film having a favorable adhesion property to the substrate 100, a film including Ti, Mo, Mn, Cu, or Al may be used. For example, a Ti film, a titanium nitride film, a Ti—Mo alloy film, or a Cu—Mn—Al alloy film may be used.

The gate insulating film 112 may be formed to have a single-layer structure or a stacked-layer structure, using silicon oxide, silicon oxynitride, silicon nitride oxide, silicon nitride, aluminum oxide, hafnium oxide, yttrium oxide, zirconium oxide, yttrium-oxide-stabilized zirconium oxide (YSZ), or the like. Further, the gate insulating film 112 is preferably a film from which oxygen is released by heat treatment. Such a film from which oxygen is released by heat treatment allows defects generated in the oxide semiconductor film 106 to be reduced, thereby suppressing deterioration in electrical characteristics of the transistor.

In this specification, silicon oxynitride refers to a substance that contains more oxygen than nitrogen and for example, silicon oxynitride includes oxygen, nitrogen, silicon, and hydrogen at concentrations ranging from greater than or equal to 50 at % and less than or equal to 70 at %, greater than or equal to 0.5 at % and less than or equal to 15 at %, greater than or equal to 25 at % and less than or equal to 35 at %, and greater than or equal to 0 at % and less than or equal to 10 at %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 at % and less than or equal to 30 at %, greater than or equal to 20 at % and less than or equal to 55 at %, greater than or equal to 25 at % and less than or equal to 35 at %, and greater than or equal to 10 at % and less than or equal to 25 at %, respectively. Note that rates of oxygen, nitrogen, silicon, and hydrogen fall within the above ranges in the cases where measurement is performed using Rutherford backscattering spectrometry (RBS) or hydrogen forward scattering spectrometry (HFS). In addition, the total of the percentages of the constituent elements does not exceed 100 at %.

By using a substrate from which oxygen is released by heat treatment as the substrate 100 in the transistor illustrated in FIGS. 1A and 1B, the transistor can have favorable electrical characteristics even if a base film is not provided below the oxide semiconductor film 106.

Further, the structure without the base film does not generate the interface state between the substrate and the base film. Therefore, deterioration in electrical characteristics of the transistor, which is caused by such an interface state, can be reduced; accordingly, a highly-reliable transistor can be obtained.

However, this embodiment of the present invention does not exclude the structure provided with a base film over the substrate 100. For example, an oxygen-transmitting base film may be provided over the substrate 100, and specifically, a silicon oxide film or a silicon oxynitride film may be provided with a thickness of more than or equal to 1 nm and less than or equal to 100 nm, preferably more than or equal to 1 nm and less than or equal to 50 nm.

In some cases, even a material with low oxygen-transmitting property may transmit oxygen if it is deposited extremely thin. Specifically, instead of the oxygen-transmitting film, a film including at least one of the following materials may be provided with a thickness of more than or equal to 1 nm and less than 15 nm, preferably more than or equal to 1 nm and less than 10 nm: aluminum oxide, gallium oxide, magnesium oxide, titanium oxide, vanadium oxide, yttrium oxide, zirco-nium oxide, niobium oxide, molybdenum oxide, indium oxide, tin oxide, lanthanum oxide, neodymium oxide, hafnium oxide, tantalum oxide, and tungsten oxide.

In the case of providing the oxygen-transmitting base film over the substrate from which oxygen is released by heat treatment in the above-described manner, the interface state density at the interface between the substrate and the base film is reduced owing to the oxygen released by the heat treatment.

Such a base film can prevent impurities in the substrate 100 from diffusing into the oxide semiconductor film 106.

Next, a manufacturing method of the transistor illustrated in FIGS. 1A and 1B will be described with reference to FIGS. 5A to 5D.

Figure 5A:
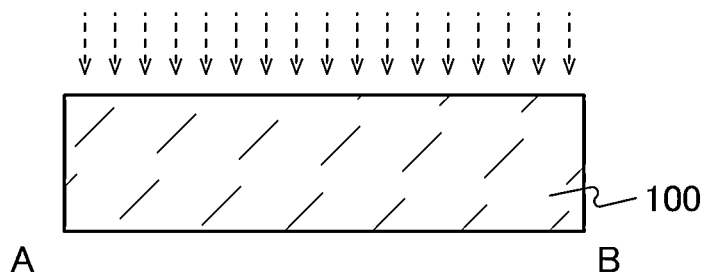
FIGS. 5A to 5D are cross-sectional views of an example of a manufacturing method of a semiconductor device.

First, oxygen ions are implanted into a surface of the substrate 100, over which the transistor is to be manufactured (see FIG. 5A).

The conditions of the implantation of oxygen ions are determined so that the depth at which the concentration of implanted oxygen ions peaks is more than or equal to 10 nm and less than 120 nm, preferably more than or equal to 40 nm and less than or equal to 70 nm. When the depth at which the concentration of implanted oxygen ions peaks is within the above range, the temperature for releasing the oxygen can be more than or equal to 200° C. and less than or equal to 700° C., preferably more than or equal to 250° C. and less than or equal to 550° C.

For example, the implantation of oxygen ions is performed in the following conditions. The acceleration voltage is more than or equal to 5 keV and less than 50 keV, preferably more than or equal to 20 keV and less than or equal to 30 keV. The amount of implanted oxygen ions is more than or equal to $3.0 \times 10^{14}$ ions/cm$^2$, preferably more than or equal to $1.0 \times 10^{15}$ ions/cm$^2$, further preferably more than or equal to $3.0 \times 10^{15}$ ions/cm$^2$, still further preferably more than or equal to $5.0 \times 10^{15}$ ions/cm$^2$, and further preferably more than or equal to $1.0 \times 10^{16}$ ions/cm$^2$. An excessive amount of implanted oxygen ions leads to a reduction in productivity; accordingly, the amount of implanted oxygen ions is for example set to be less than or equal to $1.0 \times 10^{17}$ ions/cm$^2$. An embodiment of the present invention does not exclude the acceleration voltage in the range of less than 5 keV. In the case where stable beam current is obtained, the acceleration voltage can be less than 5 keV.

The conditions of the implantation of oxygen ions are determined so that the depth at which the concentration of implanted oxygen ions peaks is more than or equal to 120 nm and less than or equal to 1000 nm, preferably more than or equal to 200 nm and less than or equal to 500 nm. When the depth at which the concentration of implanted oxygen ions peaks is within the above range, the temperature for releasing the oxygen can be more than or equal to 250° C. and less than or equal to 1000° C., preferably more than or equal to 350° C. and less than or equal to 700° C. The depth at which the concentration of implanted oxygen ions peaks may exceed the above range, which may however cause the temperature for releasing oxygen to be more than or equal to the strain point of the substrate 100. Therefore, the depth at which the concentration of implanted oxygen ions peaks is preferably adjusted in consideration of the maximum heating temperature in the process.

For example, the implantation of oxygen ions is performed in the following conditions. The acceleration voltage is more than or equal to 50 keV and less than or equal to 500 keV, preferably more than or equal to 100 keV and less than or equal to 300 keV. The amount of implanted oxygen ions is more than or equal to $3.0 \times 10^{14}$ ions/cm$^2$, preferably more than or equal to $1.0 \times 10^{15}$ ions/cm$^2$, further preferably more than or equal to $3.0 \times 10^{15}$ ions/cm$^2$, still further preferably more than or equal to $5.0 \times 10^{15}$ ions/cm$^2$, and further preferably more than or equal to $1.0 \times 10^{16}$ ions/cm$^2$. An excessive amount of implanted oxygen ions leads to a reduction in productivity; accordingly, the amount of implanted oxygen ions is for example set to be less than or equal to $1.0 \times 10^{17}$ ions/cm$^2$.

Note that the valence of the oxygen ions may be adjusted in order to increase the acceleration voltage. For example, if the acceleration voltage is more than or equal to 5 keV and less than or equal to 320 keV, an oxygen ion having a valence of 1 (O$^+$) is employed. If the acceleration voltage is more than or equal to 10 keV and less than or equal to 640 keV, an oxygen ion having a valence of 2 (O$^{2+}$) is employed. If the acceleration voltage is more than or equal to 15 keV and less than or equal to 960 keV, an oxygen ion having a valence of 3 (O$^{3+}$) is employed. However, these ranges of accelerated voltages are only roughly-estimated acceleration voltages, and combinations of the acceleration voltage and the valence of oxygen ions other than those described above may also be employed.

The amount of oxygen ions released from the substrate 100 as oxygen molecules and oxygen atoms by heat treatment can be almost equal to the amount of oxygen ions implanted into the substrate 100.

The implantation of oxygen ions into the substrate 100 leads to a reduction in the amount of water released from the substrate 100; one cause for this is sputtering of water on the surface of the substrate 100 at the time of implanting oxygen ions. Water, which is a cause of reliability reduction of transistors including an oxide semiconductor film, is preferably reduced.

The implantation of oxygen ions into the substrate 100 leads to a reduction in the amount of carbon released from the substrate 100; one cause for this is sputtering of an organic substance on the surface of the substrate 100 at the time of implanting oxygen ions. Carbon, which can be a cause inhibiting crystallization of an oxide semiconductor film, is preferably reduced.

The depth of the implanted oxygen ions affects the ease of oxygen release by heat treatment. For this reason, the ease of oxygen release by heat treatment can be adjusted with the acceleration voltage. The ease of oxygen release can also be called the temperature for releasing oxygen from one aspect of view. Thus, as the depth of the implanted oxygen ions is greater, in other words, as the acceleration voltage at the time of implanting oxygen ions is higher, the temperature for releasing oxygen is higher. Similarly, as the depth of the implanted oxygen ions is shorter, in other words, as the acceleration voltage at the time of implanting oxygen ions is lower, the temperature for releasing oxygen is lower. Note that the ease of oxygen release does not depend on only the temperature for releasing oxygen. For example, the time until the release of oxygen also affects the ease of oxygen release.

In the case where the temperature for releasing oxygen is increased, oxygen release can be suppressed during the manufacturing process of the transistor in which high-temperature step is needed. In the case where the temperature for releasing oxygen is decreased, oxygen can be supplied to the oxide semiconductor film even at low temperature in manufacture of the transistor.

Since the temperature for releasing oxygen can be adjusted, the process selectivity can be increased in manufacture of the transistor. Specifically, the maximum heating temperature in the process can be freely selected; as a result, a variation in electrical characteristics of transistors can be suppressed. Thus, a transistor can be provided at high yield and high productivity. In addition, reliability of the transistor can be improved.

Note that an oxygen-transmitting base film may be provided over the substrate 100. The oxygen-transmitting base film may be formed by a sputtering method, an MBE method, a PLD method, an ALD method, or the like. The oxygen-transmitting base film may be formed before the implantation of oxygen ions. Alternatively, the oxygen-transmitting base film may be formed after the implantation of oxygen ions. In the case of performing implantation of oxygen ions after the oxygen-transmitting base film is provided, the acceleration voltage for implanting oxygen ions is preferably set to be high in order to implant oxygen ions to a desired depth in the substrate 100.

The substrate 100 preferably has as high planarity as possible. For achieving the high planarity, the substrate 100 may be subjected to planarization treatment. As the planarization treatment, chemical mechanical polishing (CMP), a reverse sputtering method, or the like may be used.

Here, a reverse sputtering method refers to the one in which ions collide with a surface to be processed so that the surface is modified, in contrast to normal sputtering in which ions collide with a sputtering target. As the method in which ions collide with a surface to be processed, for example, a method is given in which a high frequency voltage is applied to the surface to be processed in a rare gas (such as helium, neon, argon, krypton, or xenon) atmosphere to generate plasma in the vicinity of the surface. Note that, instead of a rare gas atmosphere, an atmosphere of nitrogen, oxygen, or the like may be used. The apparatus used for the sputtering method is not limited to a sputtering apparatus, and the same treatment can also be performed with a plasma CVD apparatus, a dry etching apparatus, or the like.

It is preferable that the substrate 100 be subjected to treatment for reducing impurities in advance of the implantation of oxygen ions. As the treatment for reducing impurities, at least one of heat treatment, plasma treatment, chemical treatment, and the like is preferably performed. Note that the treatment for reducing impurities is performed in an environment with low impurity concentration.

Figure 5B:
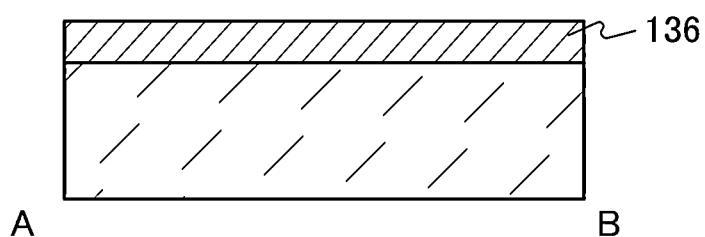

Next, an oxide semiconductor film 136 is deposited (see FIG. 5B). The oxide semiconductor film 136 may be deposited by a sputtering method, an MBE method, a PLD method, an ALD method, or the like. It is preferable to employ a sputtering method.

A method for depositing the oxide semiconductor film 136 by a sputtering method is described below. For example, the oxide semiconductor film 136 is deposited using a target containing the above-described material, which is applicable to the oxide semiconductor film 106, and a deposition gas containing one or more kinds of a rare gas, nitrogen, and oxygen.

Here, in order to form a CAAC-OS film with high degree of crystallinity or a polycrystalline film as the oxide semiconductor film 136, in addition to the high planarity of the substrate 100, high deposition power, low deposition pressure, short T-S distance, and high substrate heating temperature (Tsub) are important.

Specifically, the deposition power per unit area is set to be more than or equal to 5 W/cm$^2$ and less than or equal to 50 W/cm$^2$; the deposition pressure is set to be more than or equal to 0.01 Pa and less than or equal to 0.4 Pa, preferably more than or equal to 0.05 Pa and less than or equal to 0.3 Pa; the T-S distance is set to be more than or equal to 10 mm and less than or equal to 200 mm, preferably more than or equal to 20 mm and less than or equal to 80 mm; Tsub is set to be higher than or equal to 100° C. and lower than or equal to 500° C., preferably higher than or equal to 150° C. and lower than or equal to 450° C.

The concentration of impurities in the oxide semiconductor film 136 is preferably as low as possible. In order to reduce the concentration of impurities in the oxide semiconductor film 136, it is effective to increase the purity of the material and reduce the internal leak and the external leak of a deposition chamber.

First heat treatment is preferably performed after the oxide semiconductor film 136 is formed. With the first heat treatment, the degree of crystallinity of the oxide semiconductor film 136 can be increased and/or the concentration of impurities in the oxide semiconductor film 136 can be reduced.

The first heat treatment is preferably performed in an oxidizing atmosphere, an inert atmosphere, a reduced-pressure atmosphere, or a dry-air atmosphere at a temperature higher than or equal to 150° C. and lower than or equal to 650° C., preferably higher than or equal to 250° C. and lower than or equal to 500° C., further preferably higher than or equal to 300° C. and lower than or equal to 450° C. A resistance heating method, a lamp heating method, a method using a heated gas, or the like may be used in the first heat treatment.

Note that an oxidizing atmosphere refers to an atmosphere containing an oxidizing gas. The oxidizing gas is oxygen, ozone, nitrous oxide, or the like, and it is preferable that the oxidizing gas do not contain water, hydrogen, and the like. For example, the purity of oxygen, ozone, or nitrous oxide introduced into a heat treatment apparatus is 8 N (99.999999%) or higher, preferably 9 N (99.9999999%) or higher. As the oxidizing atmosphere, an oxidizing gas mixed with an inert gas may be used. In that case, the mixture contains an oxidizing gas at a concentration at least greater than or equal to 10 ppm.

Further, an inert atmosphere refers to an atmosphere containing an inert gas such as nitrogen or a rare gas as the main component. Specifically, the concentration of a reactive gas such as an oxidizing gas is lower than 10 ppm.

A reduced-pressure atmosphere refers to an atmosphere with a pressure of a treatment chamber of lower than or equal to 10 Pa.

The dry-air atmosphere refers to an atmosphere with a dew point lower than or equal to −40° C., preferably lower than or equal to −50° C.

Figure 5C:
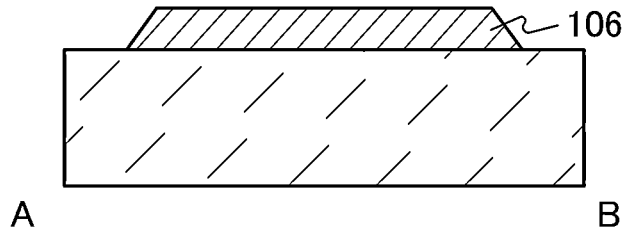
Figure 5D:
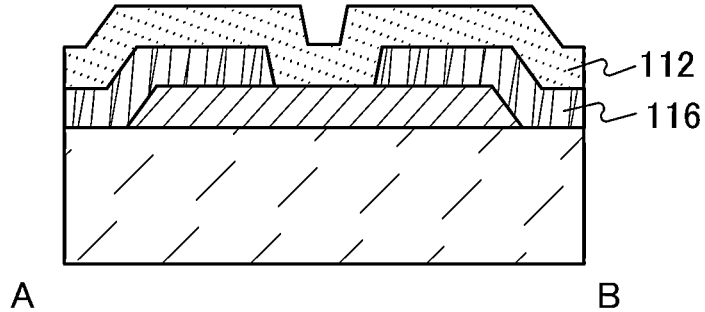

Next, the oxide semiconductor film 136 is processed into the island-shaped oxide semiconductor film 106 (see FIG. 5C). Note that "processing" means performing etching using a resist mask formed by a photolithography method to obtain a film having a desired shape.

Next, a conductive film is deposited over the oxide semiconductor film 106 and processed into the pair of electrodes 116 which is at least partly in contact with the oxide semiconductor film 106. Then, the gate insulating film 112 is deposited over the oxide semiconductor film 106 and the pair of electrodes 116 (see FIG. 5D). The conductive film to be the pair of electrodes 116 and the gate insulating film 112 can be deposited using the above material by a sputtering method, a plasma CVD method, a PLD method, an ALD method, an evaporation method, a printing method, or the like.

Next, a conductive film is deposited over the gate insulating film 112 and processed into the gate electrode 104 overlapping with the oxide semiconductor film 106. Thus, the transistor illustrated in FIGS. 1A and 1B is manufactured. The conductive film to be the gate electrode 104 can be deposited using the above material by a sputtering method, a plasma-enhanced CVD method, a PLD method, an ALD method, an evaporation method, a printing method, or the like.

Thus obtained transistor is preferably subjected to second heat treatment. The second heat treatment is preferably performed in an oxidizing atmosphere, an inert atmosphere, a reduced-pressure atmosphere, or a dry-air atmosphere at a temperature lower than the temperature of the first heat treatment. With the second heat treatment, a level generated due to oxygen vacancies in the oxide semiconductor film 106 in a manufacturing process of the transistor can be reduced, and the interface state density at the interface between the substrate 100 and the oxide semiconductor film 106 can be reduced.

The transistor manufactured so as to include the oxide semiconductor film over the substrate from which oxygen is released by heat treatment in the above-described manner can have high reliability with excellent electrical characteristics.

Next, a transistor having a structure different from that of the transistor illustrated in FIGS. 1A and 1B will be described with reference to FIGS. 2A and 2B.

Figure 2A:
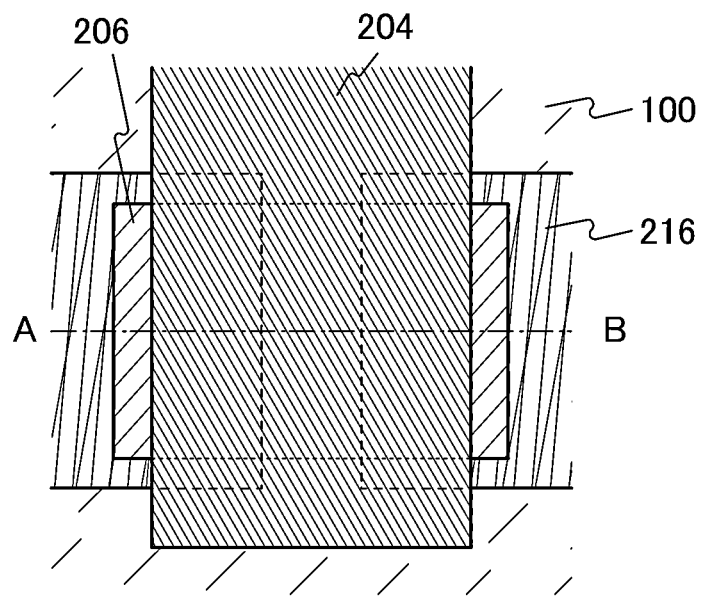
FIG. 2A is a top view of an example of a semiconductor device and FIG. 2B is a cross-sectional view thereof.
Figure 2B:
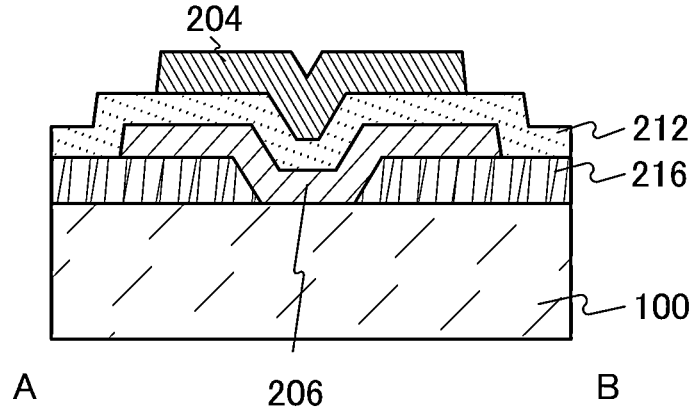

FIGS. 2A and 2B are a top view and a cross-sectional view of the transistor. A cross section along dashed-dotted line A-B in FIG. 2A corresponds to a cross section A-B in FIG. 2B.

The cross section A-B in FIG. 2B will be described in detail below.

The transistor illustrated in FIGS. 2A and 2B includes a substrate 100, a pair of electrodes 216 over the substrate 100, an oxide semiconductor film 206 which is over the pair of electrodes 216 and is at least partly in contact with the pair of electrodes 216, a gate insulating film 212 over the oxide semiconductor film 206 and the pair of electrodes 216, and a gate electrode 204 overlapping with the oxide semiconductor film 206 with the gate insulating film 212 provided therebetween.

Note that the pair of electrodes 216, the oxide semiconductor film 206, the gate insulating film 212, and the gate electrode 204 may be formed using materials similar to those of the pair of electrodes 116, the oxide semiconductor film 106, the gate insulating film 112, and the gate electrode 104, respectively.

Although the gate electrode 204 does not completely cover the oxide semiconductor film 206 in FIGS. 2A and 2B, the oxide semiconductor film 206 may be completely covered with the gate electrode 204 in order to prevent light from causing degradation of the oxide semiconductor film 206 and generation of an electric charge in the oxide semiconductor film 206.

By using a substrate from which oxygen is released by heat treatment as the substrate 100 in the transistor illustrated in FIGS. 2A and 2B, the transistor can have favorable electrical characteristics even if a base film is not provided below the oxide semiconductor film 206.

Further, the structure without the base film does not generate the interface state between the substrate 100 and the base film. Therefore, deterioration in electrical characteristics of the transistor, which is caused by such an interface state, can be reduced; accordingly, a highly-reliable transistor can be obtained.

However, this embodiment of the present invention does not exclude the structure provided with a base film over the substrate 100.

Next, a manufacturing method of the transistor illustrated in FIGS. 2A and 2B will be described with reference to FIGS. 6A to 6D.

Figure 6A:
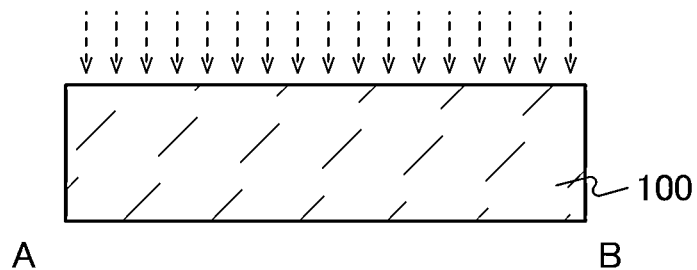
FIGS. 6A to 6D are cross-sectional views of an example of a manufacturing method of a semiconductor device.

First, oxygen ions are implanted into a surface of the substrate 100, over which the transistor is to be manufactured (see FIG. 6A). As for the method of implanting oxygen ions, refer to the description of FIGS. 5A to 5D.

Note that an oxygen-transmitting base film may be provided over the substrate 100. The oxygen-transmitting base film may be formed before the implantation of oxygen ions. Alternatively, the oxygen-transmitting base film may be formed after the implantation of oxygen ions.

Figure 6B:
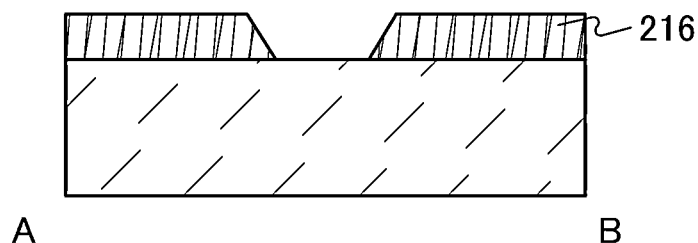
Figure 6C:
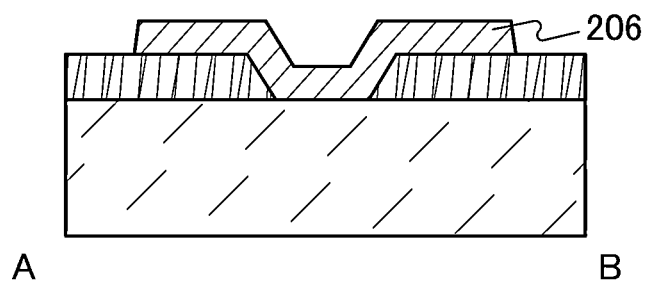

Then, the pair of electrodes 216 is formed over the substrate 100 (see FIG. 6B).

The case in which oxygen ions are implanted before the formation of the pair of electrodes 216 is described here; however, an embodiment of the present invention is not limited to this. For example, it is possible to implant oxygen ions into the substrate 100 after the formation of the pair of electrodes 216.

Next, an oxide semiconductor film is formed over the pair of electrodes 216. The first heat treatment is preferably performed after the oxide semiconductor film is formed. Then, the oxide semiconductor film is processed into the oxide semiconductor film 206 which is at least partly in contact with the pair of electrodes 216 (see FIG. 6C).

A region not overlapping with the pair of electrodes 216 in the oxide semiconductor film 206 serves as a channel formation region.

Figure 6D:
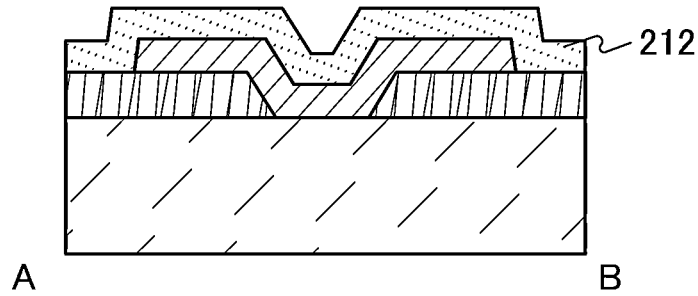

Next, the gate insulating film 212 is deposited over the oxide semiconductor film 206 and the pair of electrodes 216 (see FIG. 6D).

Next, a gate electrode 204 overlapping with the oxide semiconductor film 206 with the gate insulating film 212 interposed therebetween is formed. Thus, the transistor illustrated in FIGS. 2A and 2B is manufactured.

Thus obtained transistor is preferably subjected to second heat treatment. With the second heat treatment, a level generated due to oxygen vacancies in the oxide semiconductor film 206 in a manufacturing process of the transistor can be reduced, and the interface state density at the interface between the substrate 100 and the oxide semiconductor film 206 can be reduced.

The transistor manufactured so as to include a channel formation region of the oxide semiconductor film over the substrate from which oxygen is released by heat treatment in the above-described manner can have high reliability with excellent electrical characteristics.

Next, transistors having structures different from those of the transistors illustrated in FIGS. 1A and 1B and FIGS. 2A and 2B will be described with reference to FIGS. 3A to 3C.

Figure 3A:
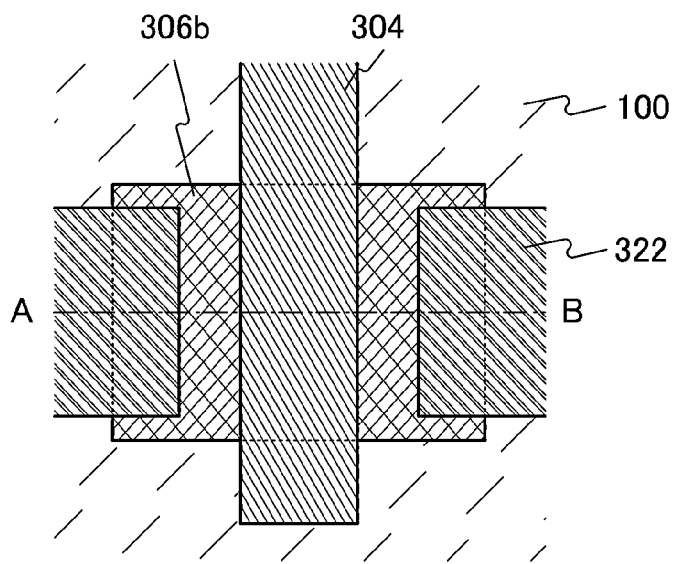
FIG. 3A is a top view of an example of a semiconductor device and FIGS. 3B and 3C are cross-sectional views thereof.
Figure 3B:
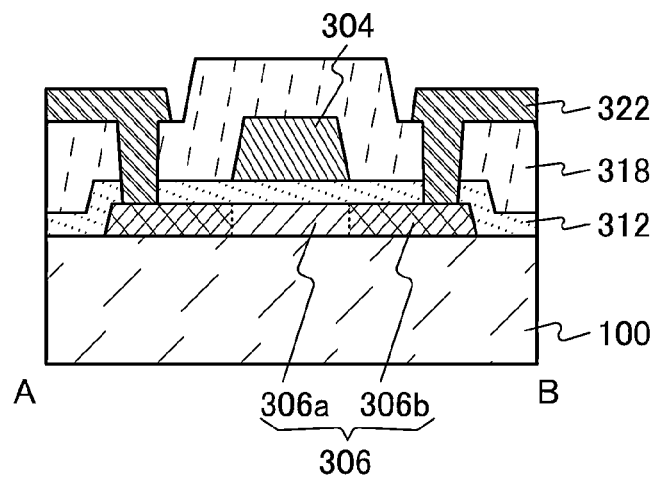
Figure 3C:
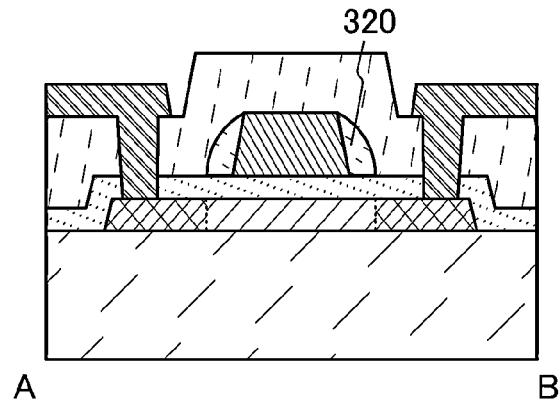

FIGS. 3A to 3C are a top view and cross-sectional views of transistors. A cross section along dashed-dotted line A-B in FIG. 3A corresponds to a cross section A-B in FIG. 3B.

The cross section A-B in FIG. 3B will be described in detail below.

The transistor illustrated in FIG. 3B includes a substrate 100, an oxide semiconductor film 306 including a high-resistance region 306a and a low-resistance region 306b over the substrate 100, a gate insulating film 312 over the oxide semiconductor film 306, a gate electrode 304 overlapping with the oxide semiconductor film 306 with the gate insulating film 312 interposed therebetween, a protective film 318 over the gate electrode 304 and the gate insulating film 312, and a wiring 322 which is over the protective film 318 and is in contact with the low-resistance region 306b through an opening provided in the gate insulating film 312 and the protective film 318.

Note that the oxide semiconductor film 306, the gate electrode 304, and the gate insulating film 312 may be formed using materials similar to those of the oxide semiconductor film 106, the gate electrode 104, and the gate insulating film 112, respectively.

The high-resistance region 306a may have substantially the same shape as the gate electrode 304 when seen from the above. Note that the low-resistance region 306b may include at least one element selected from hydrogen, helium, boron, nitrogen, fluorine, neon, aluminum, phosphorus, argon, arsenic, krypton, indium, tin, antimony, and xenon, in addition to main components of the oxide semiconductor film 306.

The protective film 318 may be formed using a material similar to that of the gate insulating film 112. The protective film 318 may be formed using a resin material or the like. The protective film 318 may have stacked layers of a plurality of materials.

The wiring 322 may be formed using a material similar to that of the pair of electrodes 116.

A sidewall insulating film 320 may be provided on the gate electrode 304 of the transistor illustrated in FIG. 3B; in other words, an embodiment of the present invention may be the transistor illustrated in FIG. 3C. The transistor illustrated in FIG. 3C is different from the transistor illustrated in FIG. 3B in that the high-resistance region 306a includes a region overlapping with the sidewall insulating film 320. In the transistor illustrated in FIG. 3C having this structure, less deterioration such as hot-carrier degradation occurs.

By using a substrate from which oxygen is released by heat treatment as the substrate 100 in the transistors illustrated in FIGS. 3A to 3C, the transistors can have favorable electrical characteristics even if a base film is not provided below the oxide semiconductor film 306.

Further, the structure without the base film does not generate the interface state between the substrate 100 and the base film. Therefore, deterioration in electrical characteristics of the transistor, which is caused by such an interface state, can be reduced; accordingly, a highly-reliable transistor can be obtained.

However, this embodiment of the present invention does not exclude the structure provided with a base film over the substrate 100.

Next, a manufacturing method of the transistor illustrated in FIGS. 3A to 3C will be described with reference to FIGS. 7A to 7D.

Figure 7A:
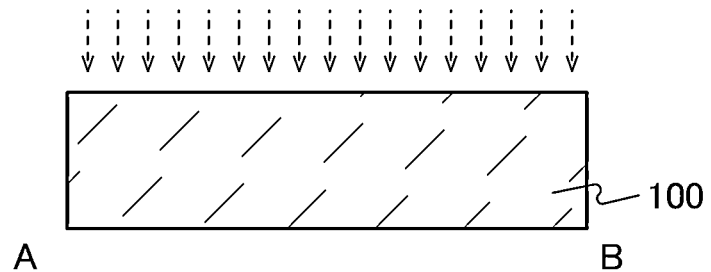
FIGS. 7A to 7D are cross-sectional views of an example of a manufacturing method of a semiconductor device.
Figure 7B:
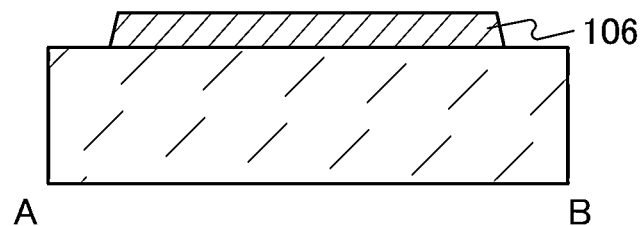
Figure 7C:
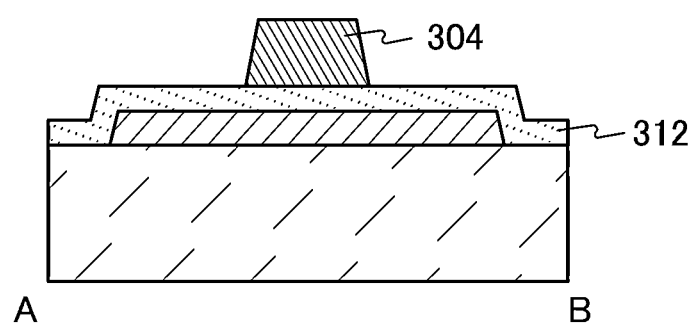
Figure 7D:
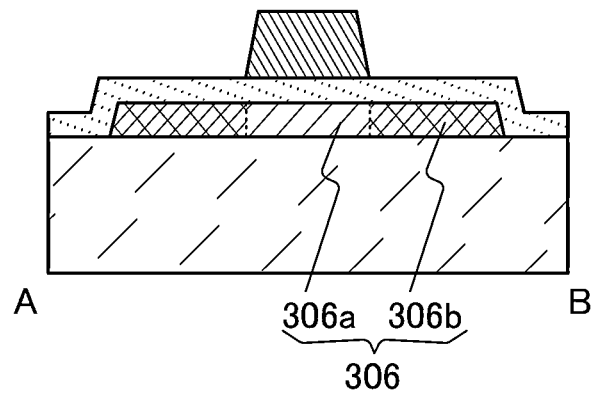

First, oxygen ions are implanted into a surface of the substrate 100, over which the transistor is to be manufactured (see FIG. 7A). As for the method of implanting oxygen ions, refer to the description of FIGS. 5A to 5D.

Note that an oxygen-transmitting base film may be provided over the substrate 100. The oxygen-transmitting base film may be formed before the implantation of oxygen ions. Alternatively, the oxygen-transmitting base film may be formed after the implantation of oxygen ions.

Next, an oxide semiconductor film is formed over the substrate 100. The first heat treatment is preferably performed after the oxide semiconductor film is formed. Then, the oxide semiconductor film is processed into the oxide semiconductor film 106 (see FIG. 7B).

Next, the gate insulating film 312 is formed over the oxide semiconductor film 106 and the substrate 100. Then, the gate electrode 304 overlapping with the oxide semiconductor film 306 with the gate insulating film 312 interposed therebetween is formed (see FIG. 7C).

To form the transistor illustrated in FIG. 3C, the sidewall insulating film 320 is formed after the formation of the gate electrode 304.

The sidewall insulating film 320 may be formed in a self-aligned manner in such a manner that an insulating film covering the gate electrode 304 is formed and then the insulating film is subjected to highly anisotropic etching. The highly anisotropic etching is preferably dry etching, for example. As an etching gas used for dry etching, for example, a gas including fluorine such as trifluoromethane, octafluorocyclobutane, or tetrafluoromethane can be used. A rare gas or hydrogen may be added to the etching gas. As the dry etching, a reactive ion etching (RIE) method in which high-frequency voltage is applied to a substrate, is preferably used.

Next, treatment by which resistance is reduced is performed on part of the oxide semiconductor film 106, using the gate electrode 304 as a mask. As the treatment by which resistance is reduced, ion implantation, ion doping, or plasma treatment is performed in an atmosphere including at least one element selected from hydrogen, helium, boron, nitrogen, fluorine, neon, aluminum, phosphorus, argon, arsenic, krypton, indium, tin, antimony, and xenon, for example. Then, third heat treatment is performed, so that the low-resistance region 306b is formed in a region of the oxide semiconductor film 306 subjected to ion implantation, ion doping, or plasma treatment. Note that the high-resistance region 306a is a region that is not subjected to treatment by which resistance is reduced such as ion implantation, ion doping, or plasma treatment (see FIG. 7D). In the case of forming the sidewall insulating film 320, the gate electrode 304 and the sidewall insulating film 320 may be used as masks in the ion implantation, ion doping, or plasma treatment. The third heat treatment may be performed using a method similar to that of the first heat treatment.

The gate insulating film 312 may be processed to have a shape similar to that of the gate electrode 304 when seen from the above, before the ion implantation, ion doping, or plasma treatment. In such a case, part of the oxide semiconductor film 106 is exposed; thus, part of the oxide semiconductor film 106 is directly exposed to plasma.

Next, the protective film 318 is formed over the oxide semiconductor film 306 and the gate electrode 304, and an opening from which the low-resistance region 306b is exposed is formed in the gate insulating film 312 and the protective film 318. The wiring 322 is formed in contact with the oxide semiconductor film 306; thus, the transistors illustrated in FIGS. 3A to 3C are manufactured.

Thus obtained transistors are preferably subjected to second heat treatment. With the second heat treatment, a level generated due to oxygen vacancies in the oxide semiconductor film 306 in a manufacturing process of the transistor can be reduced, and the interface state density at the interface between the substrate 100 and the oxide semiconductor film 306 can be reduced.

The transistor manufactured so as to include the oxide semiconductor film over the substrate from which oxygen is released by heat treatment in the above-described manner can have high reliability with excellent electrical characteristics.

Next, transistors having structures different from those of the transistors illustrated in FIGS. 3A to 3C will be described with reference to FIGS. 4A to 4C.

Figure 4A:
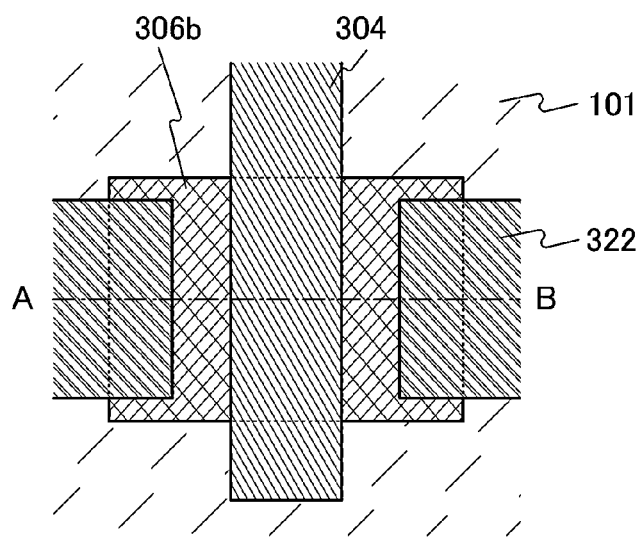
FIG. 4A is a top view of an example of a semiconductor device and FIGS. 4B and 4C are cross-sectional views thereof.
Figure 4B:
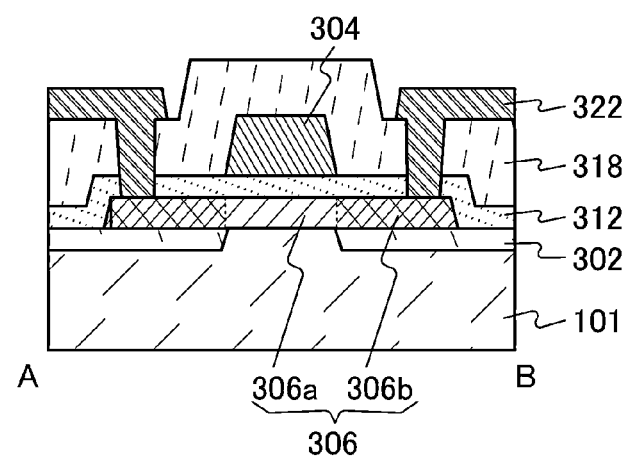
Figure 4C:
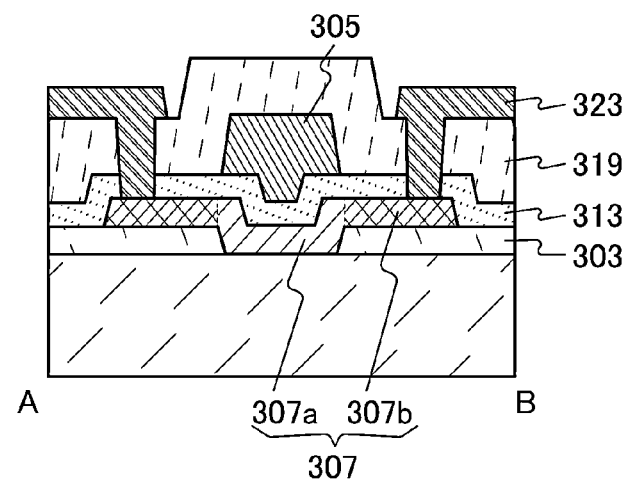

FIGS. 4A to 4C are a top view and cross-sectional views of transistors. A cross section along dashed-dotted line A-B in FIG. 4A corresponds to a cross section A-B in FIG. 4B.

The cross section A-B in FIG. 4B will be described in detail below.

The transistor illustrated in FIG. 4B includes a substrate 101 having a groove, an insulating film 302 filling the groove of the substrate 101, an oxide semiconductor film 306 including a high-resistance region 306a and a low-resistance region 306b over the substrate 101 and the insulating film 302, a gate insulating film 312 over the oxide semiconductor film 306 and the insulating film 302, a gate electrode 304 overlapping with the oxide semiconductor film 306 with the gate insulating film 312 interposed therebetween, a protective film 318 over the gate insulating film 312 and the gate electrode 304, and a wiring 322 in contact with the low-resistance region 306b through an opening provided in the gate insulating film 312 and the protective film 318.

The transistor illustrated in FIG. 4B is different from the transistor illustrated in FIG. 3B in including an insulating film 302 below the oxide semiconductor film 306.

The substrate 101 can be formed using a method and a material similar to those of the substrate 100.

The insulating film 302 is provided below the oxide semiconductor film 306, specifically below the low-resistance region 306b.

At least, the insulating film 302 is not an insulating film from which oxygen is released by heat treatment. The insulating film 302 is preferably an insulating film which does not transmits oxygen that is released from the substrate 101 by the first heat treatment and the second heat treatment to the low-resistance region 306b. In other words, the insulating film 302 is an insulating film having low or no oxygen-transmitting property or an insulating film having a diffusion coefficient of oxygen which is lower than or equal to that of the substrate 101 at a temperature range of higher than or equal to 150° C. and lower than or equal to 650° C.

For example, the insulating film 302 may include at least one element selected from aluminum oxide, gallium oxide, magnesium oxide, titanium oxide, vanadium oxide, yttrium oxide, zirconium oxide, niobium oxide, molybdenum oxide, indium oxide, tin oxide, lanthanum oxide, neodymium oxide, hafnium oxide, tantalum oxide, and tungsten oxide, for example. Preferably, the insulating film 302 is formed using a material including aluminum oxide, which is inexpensive and has low oxygen-transmitting property. Note that the insulating film 302 may have a single-layer structure or a stacked-layer structure.

The insulating film 302 has a thickness more than or equal to 15 nm and less than or equal to 300 nm, preferably more than or equal to 50 nm and less than or equal to 200 nm. Needless to say, as the insulating film 302 is thicker, it has lower oxygen-transmitting property. Note that an excessively thick insulating film may lead to a reduction in productivity; therefore, an appropriate thickness is selected.

Since the insulating film 302 is provided below the low-resistance region 306b, an increase in resistance as a result of the supply of oxygen (the addition of oxygen) to the low-resistance region 306b can be suppressed; accordingly, low resistance can be maintained. Thus, the transistor illustrated in FIG. 4B can have high on-state current.

Note that oxygen is supplied from the substrate 101 to the high-resistance region 306a by heat treatment. Thus, the transistor illustrated in FIG. 4B has high reliability.

The transistor illustrated in FIG. 4C includes a substrate 100, an insulating film 303 over the substrate 100, an oxide semiconductor film 307 including a high-resistance region 307a and a low-resistance region 307b over the substrate 100 and the insulating film 303, a gate insulating film 313 over the oxide semiconductor film 307 and the insulating film 303, a gate electrode 305 overlapping with the oxide semiconductor film 307 with the gate insulating film 313 interposed therebetween, a protective film 319 over the gate insulating film 313 and the gate electrode 305, and a wiring 323 in contact with the low-resistance region 307b through an opening provided in the gate insulating film 313 and the protective film 319.

Note that the insulating film 303, the oxide semiconductor film 307, the gate insulating film 313, the gate electrode 305, the protective film 319, and the wiring 323 may be formed using materials similar to those of the insulating film 302, the oxide semiconductor film 306, the gate insulating film 312, the gate electrode 304, the protective film 318, and the wiring 322, respectively.

The transistor illustrated in FIG. 4C is different from the transistor illustrated in FIG. 4B in including the insulating film 303 over the substrate 100.

Since the insulating film 303 is provided below the low-resistance region 307b, an increase in resistance as a result of the supply of oxygen (the addition of oxygen) to the low-resistance region 307b can be suppressed; accordingly, low resistance can be maintained. Thus, the transistor illustrated in FIG. 4C can have high on-state current.

By using a substrate from which oxygen is released by heat treatment as the substrate 101 in the transistors illustrated in FIGS. 4A to 4C, the transistors can have favorable electrical characteristics even if a base film is not provided below the oxide semiconductor film 307.

Further, the structure without the base film does not generate the interface state between the substrate 101 and the base film. Therefore, deterioration in electrical characteristics of the transistor, which is caused by such an interface state, can be reduced; accordingly, a highly-reliable transistor can be obtained.

However, this embodiment of the present invention does not exclude the structure provided with a base film over the substrate 101.

Next, a manufacturing method of the transistor illustrated in FIG. 4B will be described with reference to FIGS. 8A to 8C.

Figure 8A:
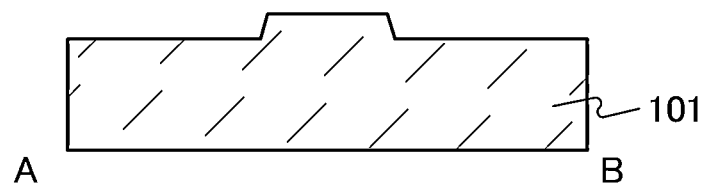
FIGS. 8A to 8C are cross-sectional views of an example of a manufacturing method of a semiconductor device.

First, the substrate 100 is processed into the substrate 101 having a groove (see FIG. 8A).

Figure 8B:
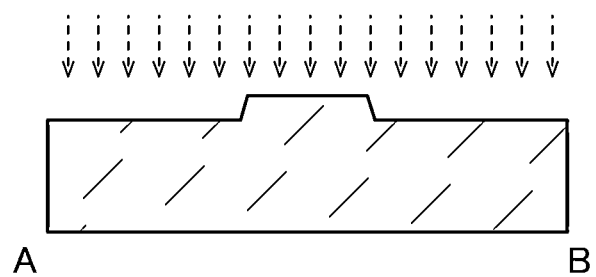

First, oxygen ions are implanted into a surface of the substrate 101, over which the transistor is to be manufactured (see FIG. 8B). As for the method of implanting oxygen ions, refer to the description of FIGS. 5A to 5D.

Note that an oxygen-transmitting base film may be provided over the substrate 101. The oxygen-transmitting base film may be formed before the implantation of oxygen ions. Alternatively, the oxygen-transmitting base film may be formed after the implantation of oxygen ions.

The case in which oxygen ions are implanted after the formation of the substrate 101 is described here; however, an embodiment of the present invention is not limited to this. For example, it is possible to process the substrate 100 into the substrate 101 after the implantation of oxygen ions into the substrate 100. In such a case, the implantation of oxygen ions may be performed after the oxygen-transmitting base film is provided over the substrate 100 or alternatively the oxygen-transmitting base film may be provided over the substrate 100 after the implantation of oxygen ions.

Further alternatively, after the oxygen-transmitting base film is provided over the substrate 100, the substrate 100 may be processed into the substrate 101, and then the implantation of oxygen ions may be performed.

Figure 8C:
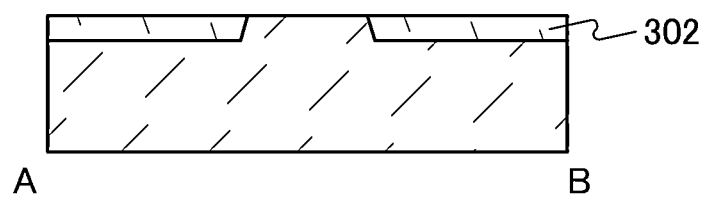

Next, an insulating film is formed over the substrate 101, and a projection portion of the insulating film is selectively etched (polished); thus, the insulating film 302 filling the groove of the substrate 101 is formed (see FIG. 8C). The polishing may be performed by CMP treatment or the like. Although part of the top surface of the substrate 101 and the top surface of the insulating film 302 form a continuous surface here, an embodiment of the present invention is not limited to this. For example, in the cross-sectional view of FIG. 8C, the top surface of the substrate 101 may be higher or lower than the top surface of the insulating film 302.

As for the following process, refer to the description of FIGS. 7A to 7D. In this manner, the transistor illustrated in FIG. 4B is manufactured.

Next, a manufacturing method of the transistor illustrated in FIG. 4C will be described with reference to FIGS. 9A to 9D.

Figure 9A:
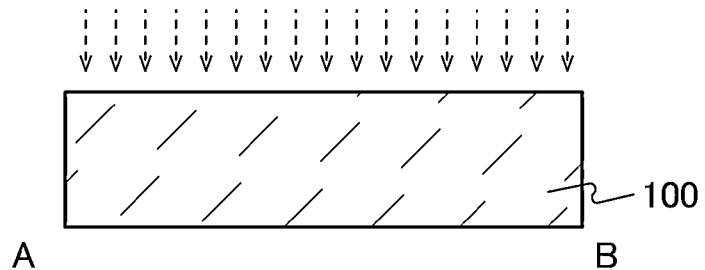
FIGS. 9A to 9D are cross-sectional views of an example of a manufacturing method of a semiconductor device.

First, oxygen ions are implanted into the substrate 100 (see FIG. 9A). As for the method of implanting oxygen ions, refer to the description of FIGS. 5A to 5D.

Figure 9B:
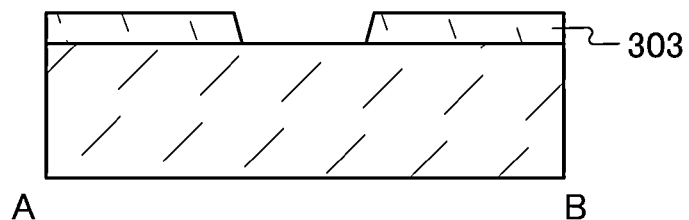
Figure 9C:
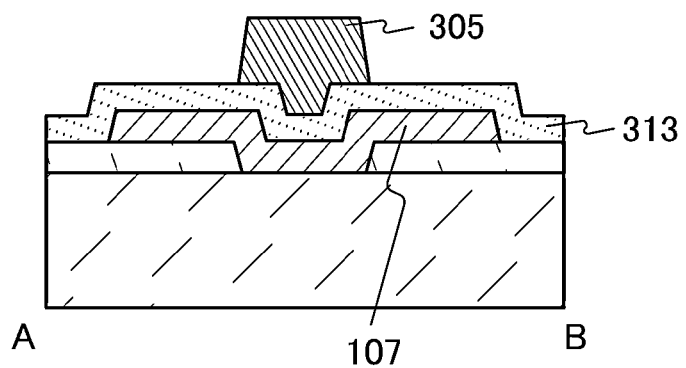

Next, an insulating film is formed over the substrate 100, and the insulating film is processed into the insulating film 303 (see FIG. 9B).

The case in which oxygen ions are implanted before the formation of the insulating film that is to be the insulating film 303 is described here; however, an embodiment of the present invention is not limited to this. For example, it is possible to implant oxygen ions into the substrate 100 after the formation of the insulating film that is to be the insulating film 303 or after the formation of the insulating film 303.

Next, an oxide semiconductor film is formed and processed into an oxide semiconductor film 107.

Next, the gate insulating film 313 is formed over the oxide semiconductor film 107 and the insulating film 303. Then, the gate electrode 305 overlapping with the oxide semiconductor film 107 with the gate insulating film 313 interposed therebetween is formed (see FIG. 9C).

After the formation of the gate electrode 305, a sidewall insulating film may be formed. As for the sidewall insulating film, refer to the description of the sidewall insulating film 320 of the transistor in FIG. 3C.

Figure 9D:
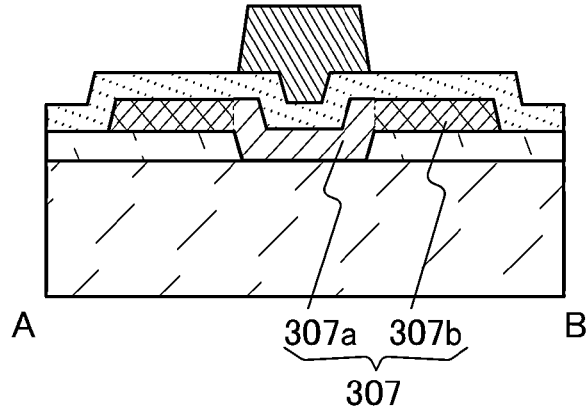

Then, part of the oxide semiconductor film 107 is subjected to the treatment by which resistance is reduced, using the gate electrode 305 as a mask, so that the oxide semiconductor film 307 including the high-resistance region 307a and the low-resistance region 307b is formed (see FIG. 9D).

Next, the protective film 319 is formed over the oxide semiconductor film 307 and the gate electrode 305, and an opening that exposes the low-resistance region 307b is formed in the gate insulating film 313 and the protective film 319. Then, the wiring 323 in contact with the oxide semiconductor film 307 is formed. Thus, the transistor illustrated in FIG. 4C is manufactured.

Thus obtained transistor is preferably subjected to second heat treatment. With the second heat treatment, a level generated due to oxygen vacancies in the oxide semiconductor film 307 in a manufacturing process of the transistor can be reduced, and the interface state density at the interface between the substrate 101 and the oxide semiconductor film 307 can be reduced.

The transistor manufactured so as to include a channel formation region of the oxide semiconductor film over the substrate from which oxygen is released by heat treatment in the above-described manner can have high reliability with excellent electrical characteristics.

This embodiment can be implemented in appropriate combination with any of the other embodiments.

Embodiment 2

In this embodiment, a liquid crystal display device manufactured using the transistor described in Embodiment 1 will be described. Note that an example in which one embodiment of the present invention is applied to a liquid crystal display device will be described in this embodiment; however, the present invention is not limited to this embodiment. For example, application of one embodiment of the present invention to an electroluminescence (EL) display device which is one of light-emitting devices is readily conceived by those skilled in the art.

Figure 10:
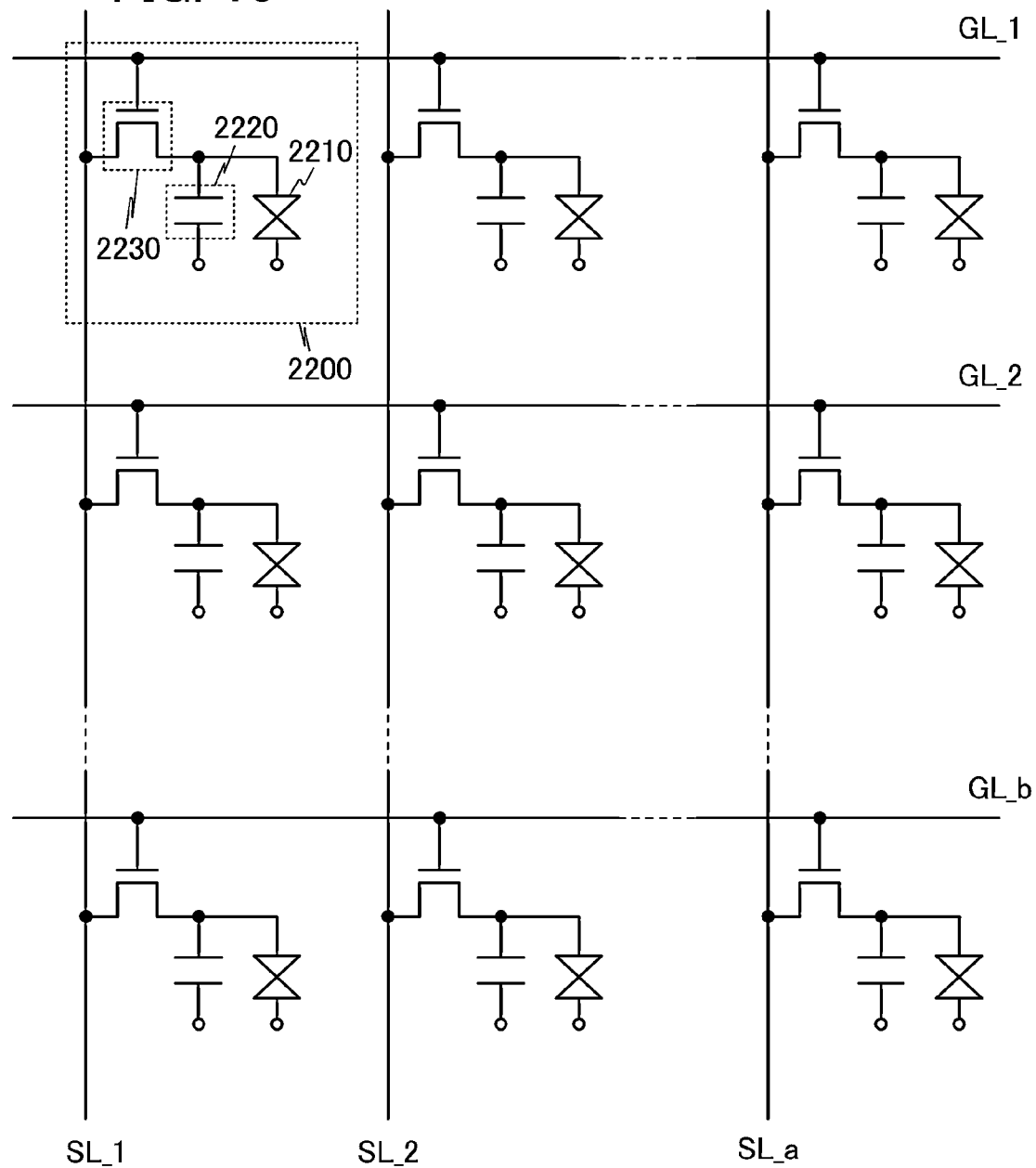
FIG. 10 is a circuit diagram of an example of a liquid crystal display device including a transistor according to an embodiment of the present invention.

FIG. 10 is a circuit diagram of an active matrix liquid crystal display device. The liquid crystal display device includes source lines SL_1 to SL_a, gate lines GL_1 to GL_b, and a plurality of pixels 2200. Each pixel 2200 includes a transistor 2230, a capacitor 2220, and a liquid crystal element 2210. The plurality of pixels 2200 with such a structure forms a pixel portion of the liquid crystal display device. In the case where the source line or the gate line is simply mentioned, it is denoted as the source line SL or the gate line GL.

As the transistor 2230, the transistor described in Embodiment 1, which is one embodiment of the present invention, is used. Since the transistor described in Embodiment 1 is a transistor including an oxide semiconductor with favorable electrical characteristics, a display device having high display quality can be obtained.

The gate line GL is connected to a gate of the transistor 2230, the source line SL is connected to a source of the transistor 2230, and a drain of the transistor 2230 is connected to one of capacitor electrodes of the capacitor 2220 and one of pixel electrodes of the liquid crystal element 2210. The other capacitor electrode of the capacitor 2220 and the other pixel electrode of the liquid crystal element 2210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 1.

The source line SL is connected to a source driver circuit. The source driver circuit may include the transistor described in Embodiment 1.

Note that one of or both the gate driver circuit and the source driver circuit may be formed over a separately prepared substrate and connected using a method such as chip on glass (COG), wire bonding, or tape automated bonding (TAB).

Further, since a transistor is easily broken by static electricity or the like, a protection circuit is preferably provided for the display device. The protection circuit is preferably formed using a nonlinear element.

When a voltage is applied to the gate line GL to be higher than or equal to the threshold voltage of the transistor 2230, electric charge supplied from the source line SL flows as a drain current of the transistor 2230 and is stored in the capacitor 2220. After charging for one row, the transistors 2230 in the row are turned off and voltage application from the source line SL stops; however, a necessary voltage can be kept by the electric charge accumulated in the capacitors 2220. Then, charging of the capacitors 2220 in the next row starts. In this manner, charging for the first row to the b-th row is carried out. Note that a drain current is a current that flows from a drain to a source through a channel in a transistor. The drain current flows when a gate voltage is higher than the threshold voltage.

Note that in the case where a transistor whose off-state current is small is used as the transistor 2230, a time period during which the capacitor 2220 holds the voltage can be longer. By this effect, the display rewriting frequency can be reduced in the case of displaying an image with little motion (including a still image); accordingly, power consumption can be further lowered. In addition, capacitance of the capacitor 2220 can be further reduced, so that power consumption needed for charging can be reduced.

In the above-described manner, according to one embodiment of the present invention, a liquid crystal display device with high display quality and low power consumption can be provided.

This embodiment can be implemented in appropriate combination with any of the other embodiments.

Embodiment 3

In this embodiment, an example of manufacturing a semiconductor memory device using the transistor described in Embodiment 1 will be described.

Typical examples of a volatile semiconductor memory device include a dynamic random access memory (DRAM) which stores data by selecting a transistor included in a memory element and accumulating an electric charge in a capacitor and a static random access memory (SRAM) which holds stored data using a circuit such as a flip-flop.

Typical examples of a nonvolatile semiconductor memory device include a flash memory which has a node between a gate electrode and a channel region of a transistor and stores data by holding an electric charge in the node.

The transistor described in Embodiment 1 can be applied to some of transistors included in the above-described semiconductor memory device.

First, a memory cell included in a semiconductor memory device to which the transistor described in Embodiment 1 is applied will be described with reference to FIGS. 11A and 11B.

Figure 11A:
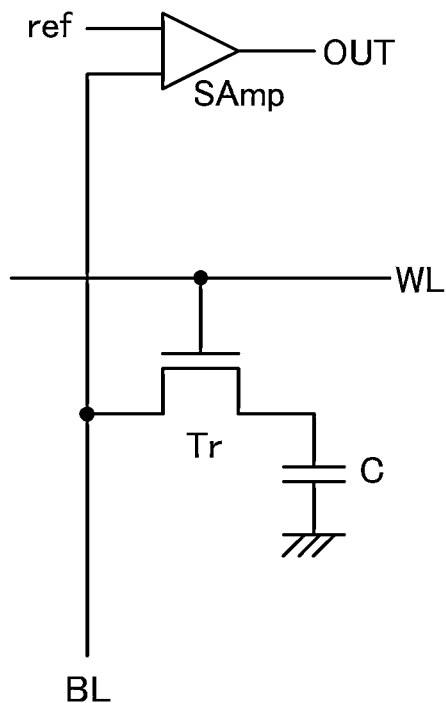
FIG. 11A is a circuit diagram of an example of a semiconductor memory device including a transistor according to an embodiment of the present invention and FIG. 11B is a graph showing electrical characteristics.

A memory cell includes a bit line BL, a word line WL, a sense amplifier SAmp, a transistor Tr, and a capacitor C (see FIG. 11A).

Figure 11B:
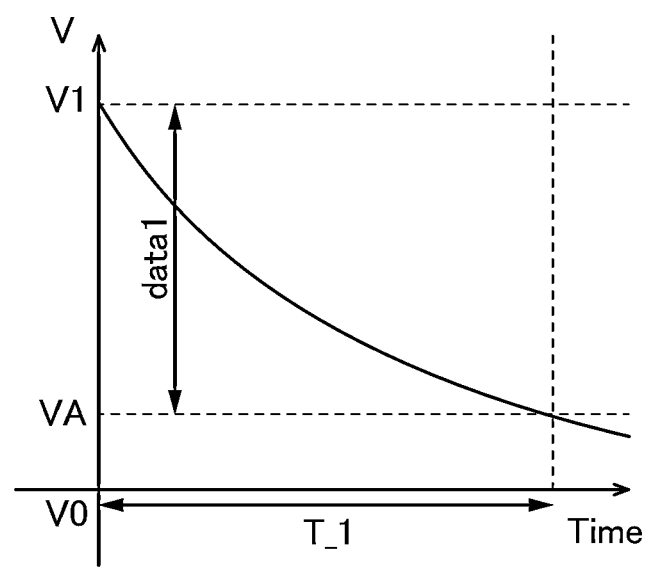

Note that it is known that the voltage held in the capacitor C is gradually decreased with time as shown in FIG. 11B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

Here, when the transistor described in Embodiment 1 is used as the transistor Tr, the holding period T_1 can be increased because off-state current is small. That is, frequency of the refresh operation can be reduced; thus, power consumption can be reduced. For example, in the case where a memory cell is formed using a transistor including a purified oxide semiconductor film in which an off-state current is less than or equal to $1 \times 10^{-21}$ A, preferably less than or equal to $1 \times 10^{-24}$ A, data can be held for several days to several tens of years without supply of electric power.

As described above, according to one embodiment of the present invention, a semiconductor memory device with high reliability and low power consumption can be provided.

Next, an example of a memory cell included in a semiconductor memory device to which the transistor described in Embodiment 1 is applied, which is different from the memory cell in FIGS. 11A and 11B, will be described with reference to FIGS. 12A and 12B.

Figure 12A:
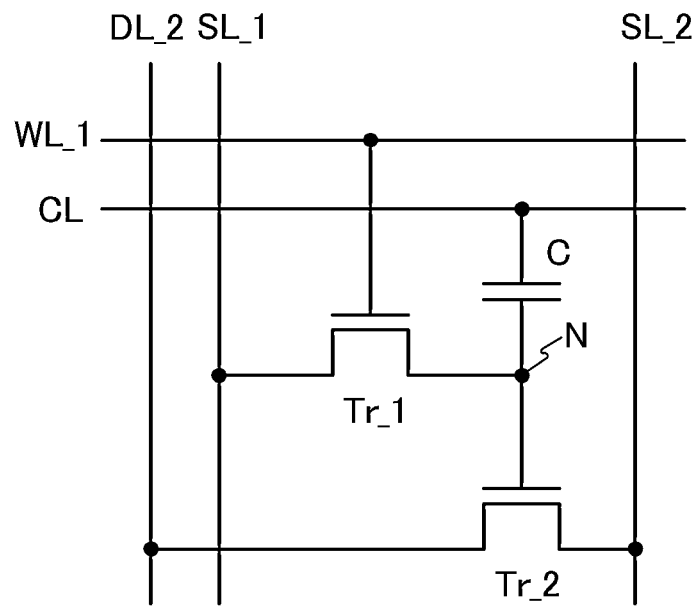
FIG. 12A is a circuit diagram of an example of a semiconductor memory device including a transistor according to an embodiment of the present invention and FIG. 12B is a graph showing electrical characteristics.
Figure 12B:
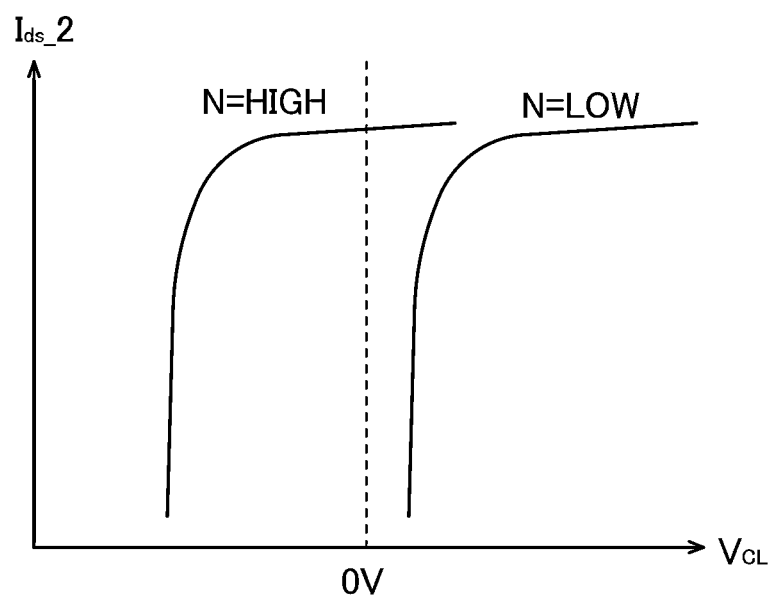

FIG. 12A is a circuit diagram of a memory cell. The memory cell includes a transistor Tr_1, a word line WL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node N connected to the other terminal of the capacitor C, a drain of the transistor Tr_1, and a gate of the transistor Tr_2.

The memory cell illustrated in FIG. 12A utilizes variation in the threshold voltage of the transistor Tr_2, which depends on the potential of the node N. For example, FIG. 12B shows a relation between a voltage $V_{CL}$ of the capacitor line CL and a drain current $I_{ds\_2}$ flowing through the transistor Tr_2.

Here, the voltage of the node N can be adjusted through the transistor Tr_1. For example, the potential of the source line SL_1 is set to a power supply potential VDD. In this case, when the potential of the word line WL_1 is set to be higher than or equal to a potential obtained by adding the power supply potential VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a $V_{CL}$-$I_{ds\_2}$ curve (N=LOW) or a $V_{CL}$-$I_{ds\_2}$ curve (N=HIGH) can be obtained. That is, when N=LOW, the drain current $I_{ds\_2}$ is small at a $V_{CL}$ of 0V; accordingly, data 0 is stored. Further, when N=HIGH, the drain current $I_{ds\_2}$ is large at a $V_{CL}$ of 0V; accordingly, data 1 is stored. In such a manner, data can be stored.

Here, when the transistor described in Embodiment 1 is used as the transistor Tr_1, the off-state current of the transistor can be significantly reduced; therefore, unintentional leakage of an electric charge accumulated in the node N by flowing between the source and the drain of the transistor Tr_1 can be suppressed. As a result, data can be held for a long time. Further, since the threshold voltage of the transistor Tr_1 according to one embodiment of the present invention is controlled, a voltage needed for writing can be reduced; thus, power consumption can be made small compared to a flash memory or the like.

Note that the transistor described in Embodiment 1 may be used as the transistor Tr_2.

As described above, according to one embodiment of the present invention, a semiconductor memory device with high reliability for a long time and low power consumption can be obtained.

This embodiment can be implemented in appropriate combination with any of the other embodiments.

Embodiment 4

A central processing unit (CPU) can be formed with the use of the transistor described in Embodiment 1 or the semiconductor memory device described in Embodiment 3 for at least part of the CPU.

Figure 13A:
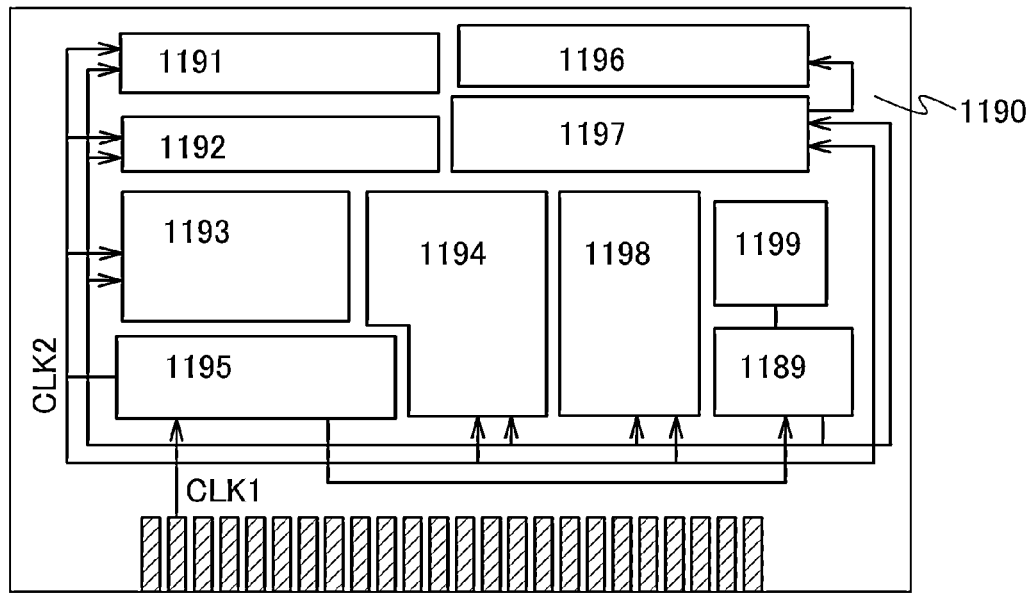
FIG. 13A is a block diagram of a specific example of a CPU including a transistor according to an embodiment of the present invention and FIGS. 13B and 13C are circuit diagrams illustrating part of the CPU.

FIG. 13A is a block diagram illustrating a specific structure of the CPU. The CPU illustrated in FIG. 13A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 13A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 13A, a memory element is provided in the register 1196. As the memory element in the register 1196, for example, the semiconductor memory device described in Embodiment 3 can be used.

In the CPU illustrated in FIG. 13A, the register controller 1197 selects operation of retaining data in the register 1196 in accordance with an instruction from the ALU 1191. That is, the register controller 1197 selects whether data is retained by a flip-flop or a capacitor in the memory element included in the register 1196. When data is retained by the flip-flop, a power supply voltage is supplied to the memory element in the register 1196. When data is retained by the capacitor, the data in the capacitor is rewritten, and supply of the power supply voltage to the memory element in the register 1196 can be stopped.

Figure 13B:
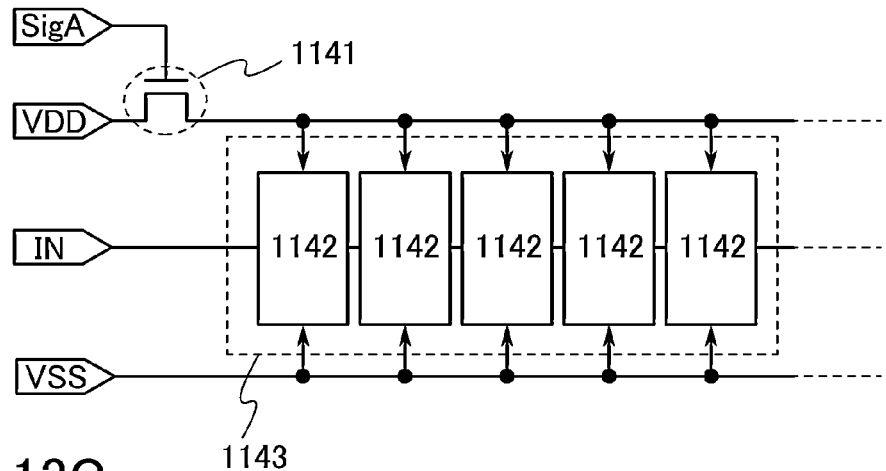
Figure 13C:
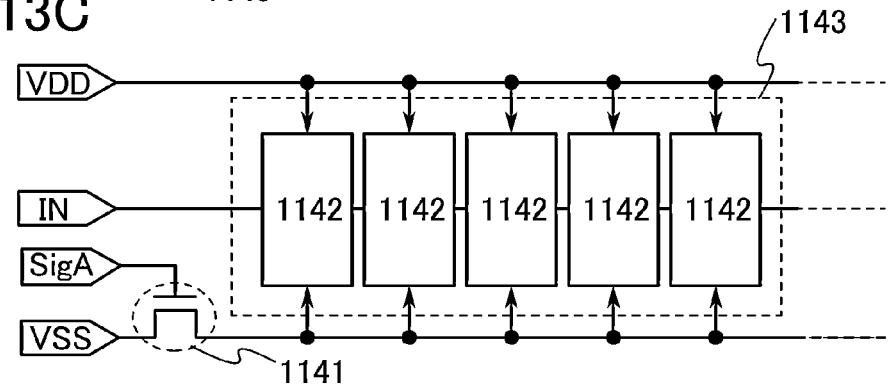

A switching element provided between a memory element group and a node to which a power supply potential VDD or a power supply potential VSS is supplied, as illustrated in FIG. 13B or FIG. 13C, allows the power supply voltage to be stopped. Circuits illustrated in FIGS. 13B and 13C will be described below.

FIGS. 13B and 13C each illustrate an example of a structure including the transistor described in Embodiment 1 as a switching element for controlling supply of a power supply potential to a memory element.

The memory device illustrated in FIG. 13B includes a switching element 1141 and a memory element group 1143 including a plurality of memory elements 1142. Specifically, as each of the memory elements 1142, the memory element described in Embodiment 3 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 13B, as the switching element 1141, a transistor in which a semiconductor with a wide band gap such as an oxide semiconductor is used for an active layer is used, and the switching of the transistor is controlled by a signal Sig A supplied to a gate electrode thereof.

Note that FIG. 13B illustrates the structure in which the switching element 1141 includes only one transistor; however, without limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 13C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with any of the other embodiments.

Embodiment 5

In this embodiment, examples of an electronic device to which any of Embodiments 1 to 4 is applied will be described.

Figure 14A:
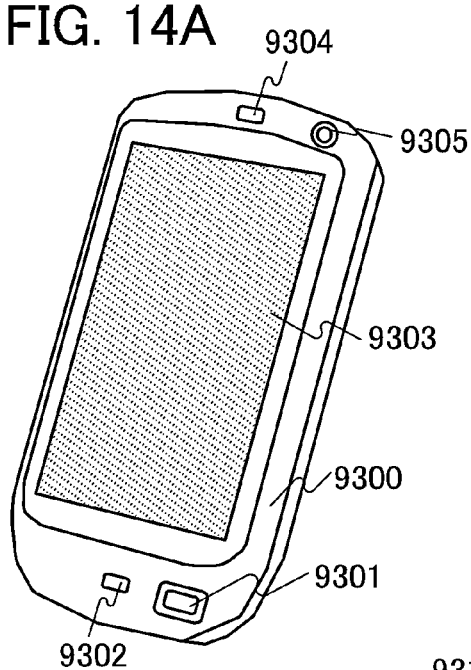
FIGS. 14A to 14C are perspective views each illustrating an example of an electronic device according to an embodiment of the present invention.

FIG. 14A illustrates a portable information terminal. The portable information terminal illustrated in FIG. 14A includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can also be applied to an arithmetic unit, a wireless circuit, or a memory circuit in a main body.

Figure 14B:
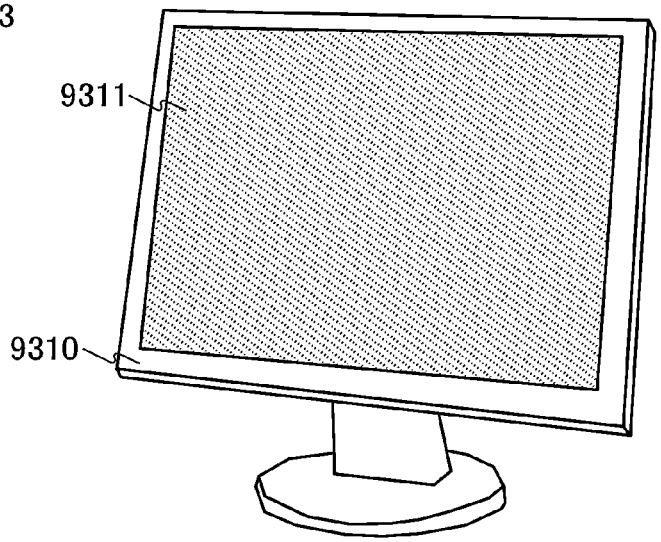

FIG. 14B illustrates a display, which includes a housing 9310 and a display portion 9311. One embodiment of the present invention can be applied to the display portion 9311. By application of one embodiment of the present invention, a display with high display quality can be provided even when the size of the display portion 9311 is increased.

Figure 14C:
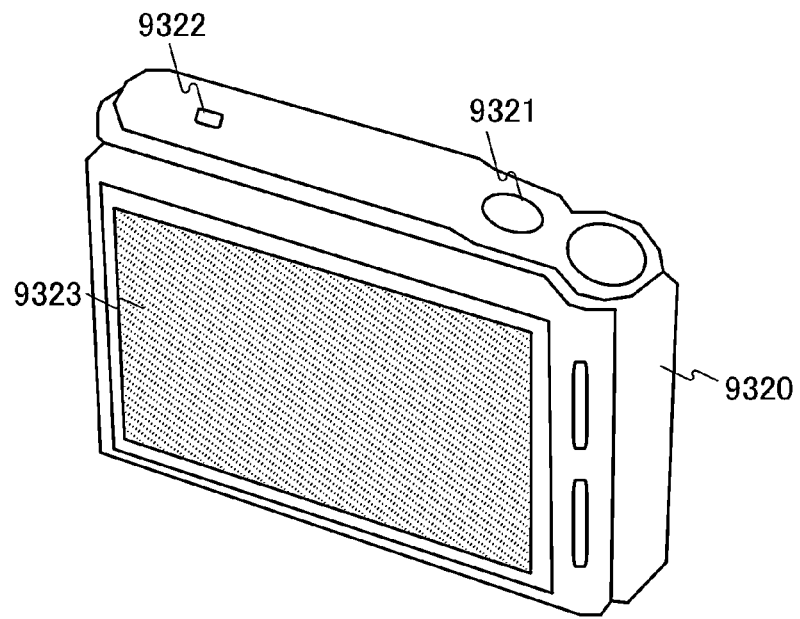

FIG. 14C illustrates a digital still camera. The digital still camera illustrated in FIG. 14C includes a housing 9320, a button 9321, a microphone 9322, and a display portion 9323. One embodiment of the present invention can be applied to the display portion 9323. Although not illustrated, one embodiment of the present invention can also be applied to a memory circuit or an image sensor.

By application of one embodiment of the present invention, the performance of an electronic device can be improved and the reliability of the electronic device can be improved.

This embodiment can be implemented in appropriate combination with any of the other embodiments.

Example 1

In this example, the amount of oxygen released from a sample of glass substrate to which oxygen ions were implanted was examined.

Note that the amount of released oxygen was measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

The sample was a 0.7-mm-thick non-alkali glass AN100 which was a glass substrate manufactured by Asahi Glass Co., Ltd and having a 10-mm-square shape.

The conditions of the implantation of oxygen ions were as follows: the acceleration voltage was 25 keV and the amount of $^{16}O^+$ ions implanted was $1.0 \times 10^{16}$ ions/cm$^2$.

Figure 15:
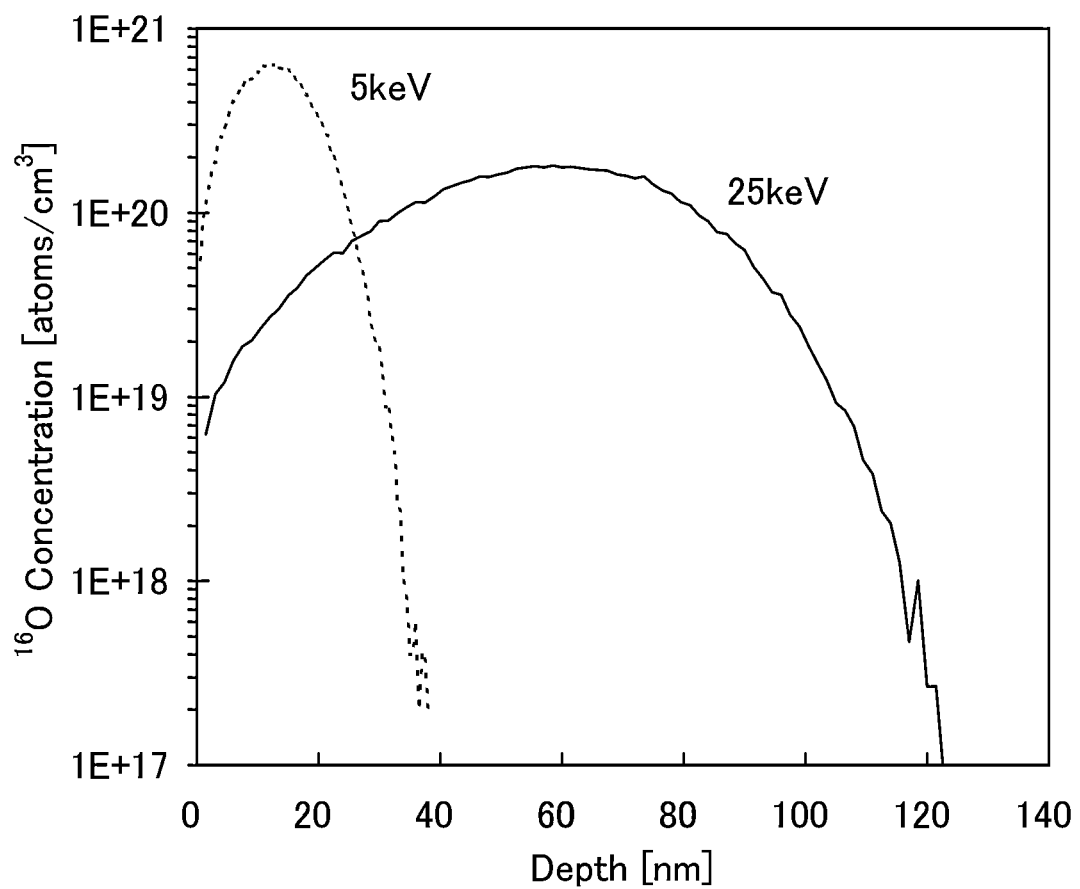
FIG. 15 shows calculation results showing the distribution of $^{16}O$ ions in the thickness direction, which are implanted into a glass substrate.

FIG. 15 shows calculation results showing the concentration distributions of $^{16}O^+$ ions in the cases where $1.0 \times 10^{16}$ ions/cm$^2$ of $^{16}O^+$ ions are implanted at acceleration voltages of 5 keV and 25 keV. For the calculation, a transport of ion in matter (TRIM) was used. Note that the density of a layer into which the oxygen ions were implanted was assumed to be 2.51 g/cm$^3$.

As shown in FIG. 15, the peak of the depth of the implanted $^{16}O$ ions is thicker as the acceleration voltage is higher; thus, the depth of the implanted $^{16}O$ ions can be adjusted with the acceleration voltage.

The depth of the implanted $^{16}O$ ions affects the ease of oxygen release by heat treatment. Therefore, the calculation results reveal that the ease of oxygen release by heat treatment can be adjusted with the acceleration voltage.

Figure 16A:
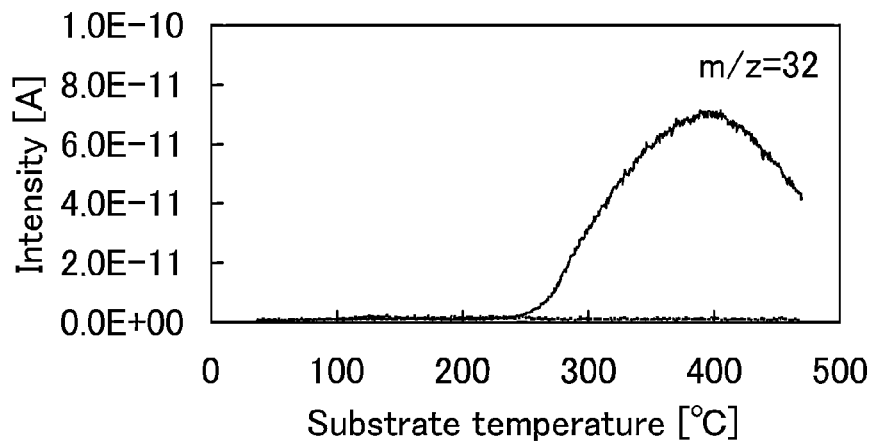
FIGS. 16A to 16C show TDS results showing the intensity of oxygen released from a glass substrate.
Figure 16B:
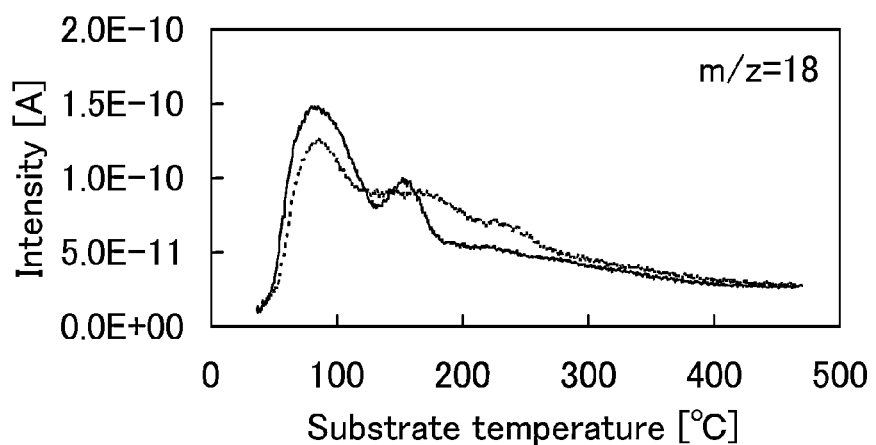
Figure 16C:
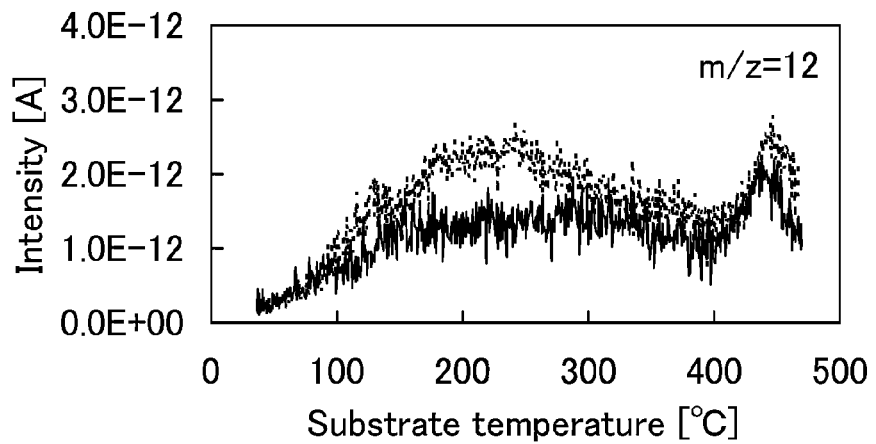

FIGS. 16A to 16C show TDS analysis results of gasses measured at m/z=32 (see FIG. 16A), m/z=18 (see FIG. 16B), and m/z=12 (see FIG. 16C). In FIGS. 16A to 16C, a dotted line indicates TDS analysis results of a glass substrate to which oxygen ions are not implanted, and a solid line indicates TDS analysis results of a glass substrate to which oxygen ions are implanted.

From the glass substrate into which oxygen ions were not implanted, a distinct release was not detected in the substrate temperature range higher than or equal to 250° C. and lower than or equal to 470° C. in the TDS analysis results of a gas measured at m/z=32. In contrast, from the glass substrate into which oxygen ions were implanted, a peak was detected in the above-mentioned substrate temperature range in the TDS analysis results of a gas measured at m/z=32. In this example, the TDS analysis was conducted in the substrate temperature range up to and equal to 470° C. for convenience of the analysis apparatus and samples; however, a peak may be detected at a temperature higher than 470° C. depending on the conditions of the implantation of oxygen ions. There arises no problem even if a peak is detected at a temperature higher than 470° C.

The fact that the release is detected only from the glass substrate into which oxygen ions were implanted suggests that the peak detected in the case where a gas measured at m/z=32 in the substrate temperature range higher than or equal to 250° C. and lower than or equal to 470° C. is substantially attributed to oxygen atoms and oxygen molecules.

The amount of released oxygen analyzed by TDS was $6.6 \times 10^{15}$ atoms/cm$^2$ on an oxygen atom basis. This value can be regarded as being equivalent to the amount of implanted oxygen ions, in consideration of the release at temperatures higher than 470° C. (outside the measurement range). In other words, almost all amount of oxygen added to the glass substrate by oxygen ion implantation is released by heat treatment. Accordingly, the amount of oxygen released from the substrate can be adjusted by the amount of implanted oxygen ions. Note that the released oxygen is not limited to being identical to the implanted oxygen ions and the implanted oxygen ions may possibly be substituted for oxygen in the glass substrate.

In the case of a gas measured at m/z=18, in the substrate temperature range higher than or equal to 190° C. and lower than or equal to 300° C., the amount of gas released from the glass substrate into which oxygen ions are implanted is smaller than the amount of gas released from the glass substrate into which oxygen ions are not implanted. This shows that the amount of gas measured at m/z=18 (presumed to be $H_2O$) released by heat treatment is reduced in the case of performing oxygen ion implantation.

In a transistor including an oxide semiconductor film, water containing hydrogen is an impurity and is a factor causing a variation in threshold voltage. By performing oxygen ion implantation, the amount of water released from a glass substrate is reduced; accordingly, electrical characteristics of the transistor can be improved.

Similarly, in the case of a gas measured at m/z=12, in the substrate temperature range higher than or equal to 100° C. and lower than or equal to 450° C., the amount of gas released from the glass substrate into which oxygen ions are implanted is smaller than the amount of gas released from the glass substrate into which oxygen ions are not implanted. This shows that the amount of gas measured at m/z=12 (presumed to be C) by heat treatment is reduced in the case of performing oxygen ion implantation.

In a transistor including an oxide semiconductor film, carbon is not a main component and serves as an impurity. Carbon inhibits crystallization of the oxide semiconductor film depending on the carbon concentration; thus, the concentration of carbon is preferably as low as possible in order to form an oxide semiconductor film such as a CAAC-OS film or a polycrystalline film. By performing oxygen ion implantation, the amount of carbon released from a glass substrate is reduced; accordingly, reliability of the transistor can be improved.

As described in this example, the implantation of oxygen ions into the substrate increases the amount of oxygen released from the substrate and reduces the amount of water and carbon released from the substrate.

This application is based on Japanese Patent Application serial no. 2011-152016 filed with Japan Patent Office on Jul. 8, 2011, the entire contents of which are hereby incorporated by reference.

What is claimed is:

1. A semiconductor device comprising:
   a glass substrate from which a gas with a mass-to-charge ratio of 32 is detected by thermal desorption spectroscopy;
   an oxide semiconductor film over and in direct contact with the glass substrate, the oxide semiconductor film comprising a first region and a second region;
   a gate insulating film over the oxide semiconductor film; and
   a gate electrode overlapping with the oxide semiconductor film with the gate insulating film interposed therebetween,
   wherein an amount of the gas detected by the thermal desorption spectroscopy on an oxygen atom basis is greater than or equal to $3.0 \times 10^{14}$ atoms/cm$^2$, and
   wherein a resistance of the first region is lower than a resistance of the second region.

2. The semiconductor device according to claim 1, wherein the gate insulating film comprises an insulating film from which oxygen is released by heat treatment.

3. A semiconductor device comprising:
   a glass substrate from which a gas with a mass-to-charge ratio of 32 is detected by thermal desorption spectroscopy;
   an oxide semiconductor film over and in direct contact with the insulating glass substrate, the oxide semiconductor film comprising a first region and a second region;
   a pair of electrodes at least partly in contact with the first region of the oxide semiconductor film;
   a gate insulating film over the oxide semiconductor film; and
   a gate electrode overlapping with the oxide semiconductor film with the gate insulating film interposed therebetween,
   wherein an amount of the gas detected by the thermal desorption spectroscopy on an oxygen atom basis is greater than or equal to $3.0 \times 10^{14}$ atoms/cm$^2$, and
   wherein a resistance of the first region is lower than a resistance of the second region.

4. The semiconductor device according to claim 3, wherein the gate insulating film comprises an insulating film from which oxygen is released by heat treatment.

5. The semiconductor device according to claim 3, wherein the pair of electrodes is provided between the glass substrate and the oxide semiconductor film.

6. A semiconductor device comprising:
   a glass substrate from which a gas with a mass-to-charge ratio of 32 is detected by thermal desorption spectroscopy;
   an oxide semiconductor film over and in direct contact with the glass substrate;
   a gate insulating film over the oxide semiconductor film; and
   a gate electrode overlapping with the oxide semiconductor film with the gate insulating film interposed therebetween,
   wherein an amount of the gas detected by the thermal desorption spectroscopy on an oxygen atom basis is greater than or equal to $3.0 \times 10^{14}$ atoms/cm$^2$.

7. The semiconductor device according to claim 6, wherein the gate insulating film comprises an insulating film from which oxygen is released by heat treatment.

* * * * *

UNITED STATES PATENT AND TRADEMARK OFFICE
CERTIFICATE OF CORRECTION

PATENT NO. : 9,318,506 B2
APPLICATION NO. : 13/540029
DATED : April 19, 2016
INVENTOR(S) : Yuta Endo et al.

It is certified that error appears in the above-identified patent and that said Letters Patent is hereby corrected as shown below:

Specification

At column 9, line 20, "$\epsilon$" should be --$\varepsilon$--;

At column 10, line 2, "$\mu_0$ to is" should be --$\mu_0$ is--;

Claims

In claim 3, at column 36, line 19, delete "insulating".

Signed and Sealed this
Second Day of August, 2016

Michelle K. Lee
*Director of the United States Patent and Trademark Office*